(12) United States Patent
Guerra

(10) Patent No.: US 7,947,221 B2
(45) Date of Patent: May 24, 2011

(54) STRESS-INDUCED BANDGAP-SHIFTED SEMICONDUCTOR PHOTOELECTROLYTIC/PHOTO-CATALYTIC/PHOTOVOLTAIC SURFACE AND METHOD FOR MAKING SAME

(76) Inventor: John M. Guerra, Concord, MA (US)

(*) Notice: Subject to any disclaimer, the term of this patent is extended or adjusted under 35 U.S.C. 154(b) by 0 days.

(21) Appl. No.: 12/604,359

(22) Filed: Oct. 22, 2009

(65) Prior Publication Data

US 2010/0040514 A1 Feb. 18, 2010

Related U.S. Application Data

(62) Division of application No. 12/348,238, filed on Jan. 2, 2009, now Pat. No. 7,628,928, which is a division of application No. 10/424,259, filed on Apr. 26, 2003, now Pat. No. 7,485,799.

(60) Provisional application No. 60/380,169, filed on May 7, 2002.

(51) Int. Cl.
*C02F 1/32* (2006.01)
*H01L 31/042* (2006.01)

(52) U.S. Cl. ......... 422/4; 422/222; 422/29; 210/748.01; 210/739; 136/235

(58) Field of Classification Search .................. 136/235; 210/748.01–748.1, 739; 422/222, 4, 29
See application file for complete search history.

(56) References Cited

U.S. PATENT DOCUMENTS

| | | | |
|---|---|---|---|
| 4,269,170 A | 5/1981 | Guerra | |
| 4,511,638 A | 4/1985 | Sapru et al. | |
| 4,528,452 A | 7/1985 | Yamazaki | |
| 4,545,646 A | 10/1985 | Chern et al. | |
| 5,306,915 A | 4/1994 | Matthews | |
| 5,482,570 A | 1/1996 | Saurer et al. | |
| 5,578,140 A | 11/1996 | Yogev et al. | |
| 5,910,940 A | 6/1999 | Guerra | |
| 5,964,962 A | 10/1999 | Sannomiya et al. | |
| 6,072,117 A | 6/2000 | Matsuyama et al. | |
| 6,107,563 A | 8/2000 | Nakanishi et al. | |
| 6,291,763 B1 | 9/2001 | Nakamura | |
| 6,563,041 B2 | 5/2003 | Sugawara et al. | |

(Continued)

FOREIGN PATENT DOCUMENTS

JP 55-002742 1/1980

(Continued)

OTHER PUBLICATIONS

Bart J. Van Zeghbroeck, 1997, Chapter 4.8 (Photodiodes and Solar Cells) and Chapter Section 2.2.5 (Temperature and stress dependence of the energy bandgap).

(Continued)

*Primary Examiner* — Walter D Griffin
*Assistant Examiner* — Cameron J Allen
(74) *Attorney, Agent, or Firm* — David J. Cole

(57) ABSTRACT

Titania is a semiconductor and photocatalyst that is also chemically inert. With its bandgap of 3.0, to activate the photocatalytic property of titania requires light of about 390 nm wavelength, which is in the ultra-violet, where sunlight is very low in intensity. A method and devices are disclosed wherein stress is induced and managed in a thin film of titania in order to shift and lower the bandgap energy into the longer wavelengths that are more abundant in sunlight. Applications of this stress-induced bandgap-shifted titania photocatalytic surface include photoelectrolysis for production of hydrogen gas from water, photovoltaics for production of electricity, and photocatalysis for detoxification and disinfection.

12 Claims, 15 Drawing Sheets

U.S. PATENT DOCUMENTS

| | | | |
|---|---|---|---|
| 6,623,615 | B1 | 9/2003 | Morisawa et al. |
| 6,969,472 | B2 | 11/2005 | Vezenov et al. |
| 7,628,928 | B2* | 12/2009 | Guerra .................. 210/748.14 |
| 2003/0168659 | A1* | 9/2003 | Lal et al. .................. 257/49 |
| 2005/0217717 | A1 | 10/2005 | Faris |
| 2006/0172484 | A1 | 8/2006 | Chung et al. |

FOREIGN PATENT DOCUMENTS

| KR | 2007-0118064 | 12/2007 |
|---|---|---|

OTHER PUBLICATIONS

J. G. Mavroides et al., "Photoelectrolysis of water in cells with SrTiO3 anodes," Applied Physics Letters, vol. 28, No. 5, Mar. 1, 1976.

A. Fujishima and K. Honda, "Electrochemical Photolysis of Water at a Semiconductor Electrode", Nature 238, 37 (1972).

O. Khaselev and J. Turner, "A Monolithic Photovoltaic-Photoelectrochemical Device for Hydrogen Production via Water Splitting," Science, vol. 280, Apr. 17, 1998.

P. J. Sebastian et al., "Electrodeposited CIS and CIGS thin film photocatalysts for hydrogen production by photoelectrolysis".

Guerra, J. M., Photon tunneling microscopy applications, in MRS Proceedings vol. 332, M. Sarikaya et al. (eds.), p. 457 (1994).

Guerra, J.M. et al, "Embedded nano-optic media for near-field high density optical data storage: modeling, fabrication, and performance," Proceedings, Optical Data Storage Conference, SPIE, Apr. 2001.

Guerra, J. M. et al, "Near-field optical recording without low-flying heads," ISOM Technical Digest, Taipei, 2001.

Guerra, J. M. et al, "Near-field optical recording without low-flying heads: Integral Near-Field Optical (INFO) Media," Jap J. Appl. Physics, vol. 41, p. 1866 (2002).

J. M. Bennett et al, "Comparison of the properties of titanium dioxide films prepared by various techniques," Appl. Opt. 28, 3303-3317 (1989).

H.T. Tien et al., "Hydrogen generation from water . . . ", Current Topics in Biophysics, 2000, 25(1), 39-60.

T. Gerfin, M. Graetzel and L. Walder, Molecular and Supramolecular Surface Modification of Nanocrystalline TiO2 films: Charge-Separating and Charge-Injecting Devices, Progr. Inorg. Chem., 44, 345-393 (1997).

Lalanne et al., "Design, Fabrication and Characterization of Subwavelength Periodic Structures for Semiconductor Anti-Reflection Coating in the Visible Domain", Proceedings of SPIE, vol. 2776, Developments in Optical Component Coatings, Ian Reid, Editor, Aug. 1996, pp. 300-309.

M.E. Law and S. Cea, Continuum based modeling of silicon integrated circuit processing: An object oriented approach, Comp. Mater. Sci. 12, 289 (1998).

B. E. Deal and S. Grove, General Relationship for the thermal oxidation of silicon, J. Appl. Phys. 36, 3770 (Dec. 1965).

International Search Report for International Application PCT/US2009/046531.

\* cited by examiner

STRESS-INDUCED BANDGAP-SHIFTED SEMICONDUCTOR PHOTOELECTROLYTIC/PHOTO-CATALYTIC/PHOTOVOLTAIC SURFACE AND METHOD FOR MAKING SAME

REFERENCE TO RELATED APPLICATIONS

This application is a divisional of application Ser. No. 12/348,238, filed Jan. 2, 2009 (now U.S. Pat. No. 7,628,928 issued Dec. 8, 2009), which is itself a divisional of application Ser. No. 10/424,259, filed Apr. 26, 2003 (now U.S. Pat. No. 7,485,799, issued Feb. 3, 2009), which claims benefit of Provisional Application Ser. No. 60/380,169, filed May 7, 2002.

BACKGROUND OF INVENTION

Reference is made hereinafter to the following documents:
1. www.colorado.edu/~bart/book/solar.htm: Bart J. Van Zeghbroeck, 1997, Chapter 4.8 (Photodiodes and Solar Cells) and Chapter Section 2.2.5 (Temperature and stress dependence of the energy bandgap).
2. J. G. Mavroides, J. A. Kafalas, and D. F. Kolesar, "Photoelectrolysis of water in cells with $SrTiO_3$ anodes," Applied Physics Letters, Vol. 28, No. 5, 1 Mar. 1976, and references therein.
3. A. Fujishima and K. Honda, Nature, 238, 37 (1972)
4. O. Khaselev and J. Turner, "A Monolithic Photovoltaic-Photoelectrochemical Device for Hydrogen Production via Water Splitting," Science, Vol. 280, 17 Apr., 1998.
5. P. J. Sebastian, M. E. Calixto, and R. N. Bhattacharya, Electrodeposited CIS and CIGS thin film photocatalysts for hydrogen production by photoelectrolysis.
6. T. Gerfin, M. Graetzel and L. Walder, Progr. Inorg. Chem., 44, 345-393 (1997), Molecular and Supramolecular Surface Modification of Nanocrystalline $TiO_2$ films: Charge-Separating and Charge-Injecting Devices.
7. Guerra, J. M., Storage Medium Having a Layer of Micro-Optical Lenses Each Lens Generating an Evanescent Field, U.S. Pat. No. 5,910,940, Jun. 8, 1999.
8. Guerra, J. M., Adsorption Solar Heating and Storage System, U.S. Pat. No. 4,269,170, May 26, 1981.
9. Guerra, J. M., *Photon tunneling microscopy applications*, MRS Proceedings Volume 332, Determining Nanoscale Physical Properties of Materials by Microscopy and Spectroscopy, M. Sarikaya, H. K. Wickramasinghe and M. Isaacson, editors. Page 457, FIG. 8b shows tensile stress fissures in diamond-like carbon coating on a silicon substrate. FIG. 9a shows adhesion failure due to compressive stresses in a magnesium fluoride thin film coating on an acrylic substrate.
10. Guerra, J. M., Storage Medium Having a Layer of Micro-Optical Lenses Each Lens Generating an Evanescent Field (application title: Optical Recording Systems and Media with Integral Near-Field Optics), U.S. Pat. No. 5,910,940, Jun. 8, 1999. Assigned to Polaroid Corp.
11. Guerra, J. M. and D. Vezenov, Method of fabrication of sub-micron spherical micro-lenses. Patent Applied For Apr. 12, 2001.
12. Guerra, J. M. et al, "Embedded nano-optic media for near-field high density optical data storage: modeling, fabrication, and performance," Proceedings, Optical Data Storage Conference, SPIE, April, 2001.
13. Guerra, J. M. et al, "Near-field optical recording without low-flying heads," ISOM Technical Digest, Taipei, 2001.
14. Guerra, J. M. et al, "Near-field optical recording without low-flying heads: Integral Near-Field Optical (INFO) Media," *Japanese Journal of Applied Physics*, scheduled publication March 2002
15. J. M. Bennett et al, "Comparison of the properties of titanium dioxide films prepared by various techniques," Appl. Opt. 28, 3303-3317 (1989)
16. H. T. Tien and A. L. Ottova, "Hydrogen generation from water using semiconductor septum electrochemical photovoltaic (SC-SEP) cells," Current Topics in Biophysics 2000, 25(1), 39-60. Modeled on nature's photosynthetic thylakoid membrane.
17. D. Ginley et al, "Nanostructured interfaces in polymer based solar cells," National Renewable Energy Laboratory, SERF, Golden, Colo. Deposition of MEH-PPV and cyano-PPV on nanostructured $TiO_2$ for thin film photovoltaic cells.

This invention relates to photocatalytic surfaces used in the process of photoelectrolysis, photovoltaics, and photocatalysis, and more specifically to induction and management of stress in a thin titania film photocatalytic surface to match the band gap of the titania more efficiently with the solar spectrum at the earth's surface for photoelectrolysis, photovoltaics, and photocatalysis.

The ills of our carbon-based energy are well-known: pollution of land and oceans, air pollution, and the global warming that is likely caused by the latter. In addition, there is the growing dependence on foreign oil (presently at 46%, up from 27% during the Oil Embargo during the Carter administration) with the economic, political, and human costs that result from that dependence. Hydrogen has been gradually emerging as the fuel of choice for the future and perhaps even the very near future. Fuel cell technology has recently advanced exponentially, with plans for miniature fuel cells to replace batteries in the ever power-hungry personal digital devices, and for combustion engines for automobiles in which hydrogen is the fuel. This last important application has made great progress in that the hydrogen can now be safely and efficiently stored in a host of metal hydride based materials, with the hydrogen being piped to or stored at local filling stations, with the associated cost and danger. In another approach, the hydrogen is split at the engine from toxic hydrogen-bearing liquids such as gasoline and alcohols.

Ultimately, for a hydrogen-based energy to be completely beneficial, one would like to be able to split our most abundant resource, water, with a renewable energy source. Many have turned to solar cells to provide the electricity for electrolysis of water as a way to provide a stable and efficient storage for solar energy, with the stored hydrogen (adsorbed in a metal hydride, Ovshinsky et al) later used to create electric power in a fuel cell. However, the losses of the solar cell in converting sunlight to electricity, combined with the losses in the electrolytic splitting of water into hydrogen and oxygen, make for low efficiency overall. Further, the cost of the apparatus and lifetime of the components make the economic viability dim at this time.

A promising path and highly sought-after goal is to use sunlight directly to split water. The free energy required for decomposing water into gaseous $H_2$ and $O_2$ is just 1.23 eV, so this seems possible given that the peak of the solar spectrum is about 2.4 eV (ref. Mavroides). However, the threshold energy for this reaction is 6.5 eV, so direct photodissociation is not possible. However, Honda and Fujishima (Nature 238, 37 (1972)) showed that the threshold energy required can be greatly reduced by introducing a photocatalytic semiconductor surface, such as titania. Immersing single crystal titania (n-type) and Pt electrodes in an aqueous electrolyte, connected externally to form an electrolytic cell, they observed development of gaseous oxygen at the titania electrode and gaseous hydrogen at the Pt electrode when the cell was illuminated. (In other photoelectrolytic cells, hydrogen collects at the semiconductor cathode and oxygen collects at the conducting anode, with a membrane preventing their recombining.) However, while they succeeded in activating titania as a photocatalyst, they required artificial light, such as a xenon lamp, with a photon energy of greater than 3.0 eV, the energy gap of titania. Even so, their energy conversion efficiencies were low. Further, such light is in the ultraviolet part of the spectrum, and very little is present in sunlight at the surface of the earth (sunlight integrated over the 3 eV to 4 eV range is only 4 mW per square cm, compared to the 100 mW per square cm total in visible sunlight), so that titania photoelectrolysis with sunlight has less than 1% efficiency, and the photoelectrolysis quantum efficiency, independent of the solar spectrum, is only 1-2% unless a bias voltage is applied. For photoelectrolysis, as it is known, to spontaneously occur in sunlight, and with a practical efficiency, therefore requires the semiconductor to have a bandgap of about 1.7 electron volts (eV) in order to (1) have the energy required to split the water into hydrogen and oxygen gases, and (2) absorb at the peak of the solar spectrum for highest efficiency.

Following this work, others (Turner and Warren) have investigated semiconductor alloys or compounds with lower bandgaps. For example, p-type GaInP$_2$ has a bandgap of 1.8 to 1.9 eV, which would work adequately in sunlight to produce a photocurrent that can be used to break down water into hydrogen and oxygen. However, they found that surface treatments in the form of metallated porphyrins and transition metals, such as compounds of ruthenium, were necessary to suppress the bandedge migration and allow bandedge overlap to occur. Without this treatment, hydrogen and oxygen cannot be produced because the conduction band and the Fermi level of the semiconductor do not overlap the redox potentials of water, i.e. when light shines on the semiconductor, electrons build up on the surface, shifting the bandedges and Fermi level further away from the overlap of the water redox potentials. The long term surface stability of these surface treatments are not known.

Other attempts at photoelectrolytic cells with lower bandgap semiconductors typically (1) are corrosive in water, and (2) require a bias voltage, supplied by a conventional power source or by a photovoltaic cell or photodiode. The corrosion problem has been reduced by using platinum as the anode, and/or by combining different semiconductors. This again reduces economic viability.

The titania electrode in the Honda/Fujishima cell has the important advantage that it does not undergo anodic dissociation in water, and titania is much less expensive than other semiconductors. Mavroides, Kafalas, and Kolesar demonstrated somewhat higher efficiency titania cells using n-type SrTiO$_3$ for its smaller electron affinity, after having confirmed the Honda/Fujishima results with titania in earlier work. They achieved 10% maximum quantum efficiency, an order of magnitude higher than for titania, but with light with energy hv (where h is Planck's constant and v is the light frequency) at 3.8 eV, compared to 3.0 eV required for titania. They believed this increase in efficiency was the result of band bending at the anode surface that is about 0.2 eV larger than for titania, resulting from the smaller electron affinity of SrTiO$_3$. In their energy-level model for photoelectrolysis, the semiconductor serves as only the means for generating the necessary holes and electrons, without itself reacting chemically. In their model, the low quantum efficiency of titania is not due to inefficient carrier transfer, as others had shown that this was close to 100% with platinized—Pt cathodes and illuminated titania anodes, but rather to insufficient band-bending at the titania surface to cause efficient separation of the electron-hole pairs. The complete process, according to their model as in Ref. 2, (which is in substantial agreement with models of other researchers), is that photoelectrolysis occurs because electron-hole pairs generated at the semiconductor surface upon absorption of illumination with the required photon energy are separated by the electric field of the barrier, in the form of the energy-band bending at the surface, preventing recombination. The electrons move into the bulk of the anode and then through the external circuit to the cathode. There, they are transferred to the H$_2$O/H$_2$ level of the electrolyte and hydrogen gas is released:

$$2e^- + 2H_2O \rightarrow H_2 + 2OH^- \quad (1)$$

Oxygen is produced at the same time as holes are transferred from the anode surface to the OH$^-$/O$_2$ level of the electrolyte, as:

$$2p+ + 2OH^- \rightarrow \tfrac{1}{2}O2H2O \quad (2)$$

In other work that is farther a-field from this application, Graetzel invented a titania solar photovoltaic cell in which the functions of absorption of light and the separation of the electric charges ("electrons" and "holes") are not both performed by the semiconductor (titania in this case). Instead, the light absorption is performed by a dye monolayer that is adsorbed onto titania particles, in one case, and onto titania nano-crystals, in another case. In this way he avoids the problem of titania's 3.0 eV bandgap. This technology is now being commercialized by, for example, Sustainable Technologies International. Others have followed his lead and replaced the dye absorber with quantum dot particles attached to the titania particles, where the quantum dots perform the light absorption (QD Photovoltaics, The University of Queensland). In all of this work, however, there is no attempt to alter the bandgap of the titania. Also, the titania layer is required to be microns thick, and is applied as a sol-gel. Such a process requires solvents and temperatures incompatible with polymer substrates. Further, an electrolyte is required to fill the porous gaps in the titania matrix and complete the cell. This electrolyte is non-aqueous and somewhat volatile, so packaging, cell lifetime, and effect on the environment remain problematic. Efficiencies are reported to be around only 5% at this point. Most importantly, such a device provides no direct access to the titania photocatalytic surface, and so cannot be used for hydrogen production, detoxification, or disinfection.

Still further a-field is work by researchers at Oxford's Physics and Chemistry Departments, who are devising "inverted" photonic bandgap (PBG) crystals comprising polycrystalline titanium dioxides (titania), while earlier researchers achieved the same with self-assembled titania nano-spheres. Here, the bandgap is determined by the relative indices of refraction of the titania spheres and the empty or lower index media around and in between the spheres, the size of the spheres, and their geometrical arrangement. Again, there is no attempt to alter the bandgap of the titania spheres themselves, and the application is for directing, absorbing, and otherwise controlling light of a certain wavelength. The titania is used for its high refractive index of 2.4 to 2.6, which provides the desired index ratio of greater than 2 to if the immersion medium is air with in index of unity.

So, titania has also been shown to have use in photovoltaic devices. And in addition to photoelectrolysis for hydrogen production, titania's photocatalytic properties have been shown to have beneficial application to disinfection by killing biological organisms, and detoxification by breaking down toxic chemicals. It will be seen that the invention disclosed herein, by enabling titania to function well in visible light, such as sunlight, also applies to photovoltaics, disinfection, and detoxification.

In all of the above work, titania is either in the form of a slab cut from a crystal, and can be either of the most common polymorphs rutile or anatase, or is a thick film resulting from a sol gel process, or else are small particles of crystalline titania either in suspension or hot-pressed into a solid. No one is using, to our knowledge, titania in the form of a thin film deposited in a vacuum coating process.

SUMMARY OF THE INVENTION

One would like a semiconductor photocatalyst with a bandgap that is better matched to the solar spectrum and/or artificial illumination for higher efficiency or even to work at all. In this invention, the bandgap of the known chemically-inert photocatalyst titania ($TiO_2$) is shifted and broadened to be active at wavelengths more prevalent in sunlight and artificial light by inducing and managing sufficiently high stress in titania by vacuum coating a thin film of titania onto a substrate, preferably of a different Young's modulus, with bending undulations on the surface of a spatial radius similar to the film thickness. The undulated coating also serves to self-focus and concentrate the incident light required for the process, increase photocatalytic surface area, and prevent delamination of the film from the substrate. The electrical activity so induced in the band-shifted titania subsequently by visible light is applied to photoelectrolysis (hydrogen production from water and light), photovoltaics (electrical power from sunlight), photocatalytic disinfection and detoxification, point-of-use photoelectrolysis for use in internal combustion engines, for example, and stress-induced tunable bandgap components for communications. In addition, the same stress-induced thin film bandgap shifting works with other semiconductors such as amorphous silicon, and with similar benefits.

Accordingly, this invention provides for shifting, lowering, or reducing the size of, the optical bandgap of a semiconductor into optical wavelengths predominant in the illuminant by stressing the semiconductor, where the semiconductor is a thin film, and/or where the stress is caused by conditions under which the thin film is coated, and/or where the stress is caused by the shape of the substrate on a nano, micro, or macro scale, and/or where the stress is caused by the mechanical, chemical, and thermal properties of the substrate.

In accordance with further features of the invention, the bandgap is shifted into longer wavelengths by heating.

In accordance with further features of the invention, the semiconductor is titania.

In accordance with further features of the invention, the bandgap is shifted into wavelengths that are abundant in the solar spectrum.

In accordance with further features of the invention, the semiconductor is a photocatalyst.

In accordance with further features of the invention, the stress-inducing template profiles also provide a mechanical lock to the coating so that the stress can exist without causing delamination of the coating from the substrate.

In accordance with further features of the invention, the stress-inducing template profiles create additional surface area without increasing the width or length of the surface, for additional efficiency in photocatalytic action.

In accordance with further features of the invention, the photocatalyst is used to split an aqueous solution into hydrogen gas and oxygen gas when irradiated.

In accordance with further features of the invention, the illumination is from the sun.

In accordance with further features of the invention, the illumination is from artificial light.

In accordance with further features of the invention, the illumination is further concentrated by the stress-inducing template shape by self-focusing.

In accordance with further features of the invention, the concentration of the illumination is largely independent of incident illumination angle, thereby reducing or eliminating the need to track the sun in the sky.

In accordance with further features of the invention, the stress-inducing profiles in the substrate may be one-dimensional, such as cylinders, or two-dimensional, such as spheres.

In accordance with further features of the invention, the pitch of the stress-inducing profiles may be chosen relative to the desired illumination wavelength such that absorption is increased and reflection is decreased as in a photonic bandgap crystal.

In accordance with further features of the invention, the thickness of the titania layer is chosen to be ¼ of the wavelength of the desired illumination, thereby acting as an anti-reflection filter and increasing absorption and decreasing reflection.

In accordance with further features of the invention, the substrate surface profiles are chosen to be a certain shape, depth, and radius so that the titania film grows as lenses over the profiles.

In accordance with further features of the invention, the thickness of the titania is chosen so that the focal plane of said lenses is coplanar with the distal surface of the titania layer.

In accordance with further features of the invention, the additional effective surface created by the substrate stress-inducing profiles facilitates and improves heat dissipation.

In accordance with further features of the invention, the semiconductor is vacuum coated onto or into the shaped substrate.

In accordance with further features of the invention, the semiconductor is applied as a sol gel.

In accordance with further features of the invention, the semiconductor is applied with chemical vapor deposition.

In accordance with further features of the invention, the semiconductor is a contiguous film.

In accordance with further features of the invention, the semiconductor is a matrix of particles such as spheres.

In accordance with further features of the invention, the substrate can be polymer, glass, silicon, stainless steel, copper, aluminum, or substrate material.

In accordance with further features of the invention, the photocatalyst is used to detoxify a medium in contact with it.

In accordance with further features of the invention, the photocatalyst is used to disinfect a medium or biological agent in contact or proximal with it.

In accordance with further features of the invention, the substrate is transparent.

In accordance with further features of the invention, the substrate is reflective.

In accordance with further features of the invention, the substrate can be flexible.

In accordance with further features of the invention, the substrate and titania coating are compatible with a roll-to-roll web manufacturing process.

In accordance with further features of the invention, the substrate profiles are embossed into the substrate with a stamper from a master.

In accordance with further features of the invention, the substrate profiles are molded into the substrate with a stamper from a master.

In accordance with further features of the invention, the substrate profiles are caused by reticulation in the substrate or in a layer applied to the substrate.

In accordance with further features of the invention, the titania-coated substrates can be stacked in layers to increase efficiency for a given area.

In accordance with further features of the invention, said titania-coated stacked substrates may be pre-coated on the opposite side with a transparent conducting electrode such as indium tin oxide (ITO).

In accordance with further features of the invention, the titania-coated substrates are edge-illuminated.

In accordance with further features of the invention, the semiconductor is strontium titanate ($SrTiO_3$), amorphous silicon, or other semiconductor.

In accordance with further features of the invention, the titania-coated substrate(s) function as the anode in a photo-electrolytic cell, which further comprises some or all of the following: a housing, an aqueous electrolyte, a separation membrane, a cathode, and a bias source.

In accordance with further features of the invention, where the photoelectrolysis stores solar energy chemically in the form of hydrogen, and may be further combined with a metal hydride or other adsorber.

In accordance with further features of the invention, the nano-lenses improve performance in low light level and diffuse light applications.

In accordance with further features of the invention, the applications are for both terrestrial and space environments.

In accordance with further features of the invention, the illuminant is a laser diode or laser.

In accordance with further features of the invention, the illuminant is a spark between electrodes.

In accordance with further features of the invention, the illuminant is a flashlamp.

In accordance with further features of the invention, the hydrogen is produced at point of use by artificial illumination.

In accordance with further features of the invention, the substrate shape is used to increase or otherwise control the stress in the titania film.

In accordance with further features of the invention, the shape can be concave or convex or a mix of both, and the scale of the radius of curvature can be from nanometers to meters.

In accordance with further features of the invention, the substrate is a piezo device such that the amount of stress induced in the titania film, and therefore the bandgap, is tunable over a range, for use in photonics.

In accordance with further features of the invention, the substrate is temperature controlled, such that by changing the temperature the substrate contracts or expands and causes a tunable bandgap shift in the titania or other photocatalyst layer.

In accordance with further features of the invention, the substrate is a very small particle or sphere, typically several microns in diameter but as small as tens of nanometers in diameter, and the material is a polymer, glass, metal, or other material, and is coated with titania or other suitable semiconductor.

In accordance with further features of the invention, said sphere is one of many applied to a surface or surfaces, or are in suspension in a fluid, and can be applied by spraying, painting, or inkjet deposition.

In accordance with further features of the invention, the substrate is a small diameter polymer or other fiber, and the titania-coated fiber is woven into fabrics for protective clothing, or into mesh filters for water or air filtration, or into paper for envelopes that are readily anti-biotic when illuminated with daylight or artificial light.

In accordance with further features of the invention, the application is photovoltaic, and the stress is enabling (titania) or improving (amorphous silicon).

In accordance with further features of the invention, the application is photoelectrolysis.

In accordance with further features of the invention, the application is detoxification.

In accordance with further features of the invention, the application is disinfection.

In accordance with further features of the invention, the application is point-of-use photoelectrolysis.

In accordance with further features of the invention, the application is continual tuning of stress and bandgap properties for telecommunication application.

In accordance with further features of the invention, the application is to alter and improve magnetic properties of thin films applied to hard drive disks for data storage.

In accordance with further features of the invention, the application is to provide a corrugated substrate to which a desired titania or other thin film will adhere under stress but will not cause scatter or diffraction due to its sub-wavelength spatial period.

In accordance with further features of the invention, the sinusoidal interface at the high index thin film and low index substrate or low index air or water respectively further cause an effective index that varies gradually from one index to the other, with gradient index benefits of improved transmission and reduced reflection.

In accordance with further features of the invention, the photocatalyst is a thin film, thereby reducing the probability of recombination of the hole and electron pairs that occurs in bulk semiconductors in the absence of an anode (or cathode) and electrolyte.

In accordance with further features of the invention, the titania coating is evaporated from a titania target, a titanium target with oxygen bled into chamber, or a $Ti_xO_y$ target such as $Ti_2O_3$.

In accordance with further features of the invention, the titania coating may comprise rutile and/or anatase and/or other polymorphs, as well as amorphous titania.

In accordance with further features of the invention, additional thin films may be applied between the titania and the substrate in order to promote adhesion or to further modify the stress in the titania.

In accordance with further features of the invention, the combustion product is clean desalinated water, so that the photocatalytic device provides desalination and purification of water.

In accordance with further features of the invention, the point-of-use photocatalyst device is used in a hydrogen-based internal combustion engine.

Other features of the invention will be readily apparent when the following detailed description is read in connection with the drawings.

BRIEF DESCRIPTION OF THE DRAWINGS

The structure and operation of the invention, together with objects and advantages thereof, may best be understood by reading the detailed description to follow in connection with the drawings in which unique reference numerals have been used throughout for each part and wherein.

DETAILED DESCRIPTION

It is known that the bandgap of a semiconductor can be altered by (1) doping, (2) adding stress, and (3) adding heat. Herein, I disclose making use of the stress that is inherent in thin films, and specifically the tensile stress, to shift the bandgap of a semiconductor further into the visible spectrum. Bandgap-shift from local heating from self-focusing of the illuminant in the film is also disclosed as contributing to the effect, but this appears to be a secondary effect in this invention. For example, the energy bandgap of GaAs, or gallium arsenide, requires a 900° C. change in temperature to drop only 0.4 eV, from 1.5 eV at 100° C. down to 1.1 eV at 1000° C. On the other hand, significantly higher magnitude changes in stress can be achieved in this invention, and so stress is the predominant factor in the lowering of the bandgap energy.

Figure 1:
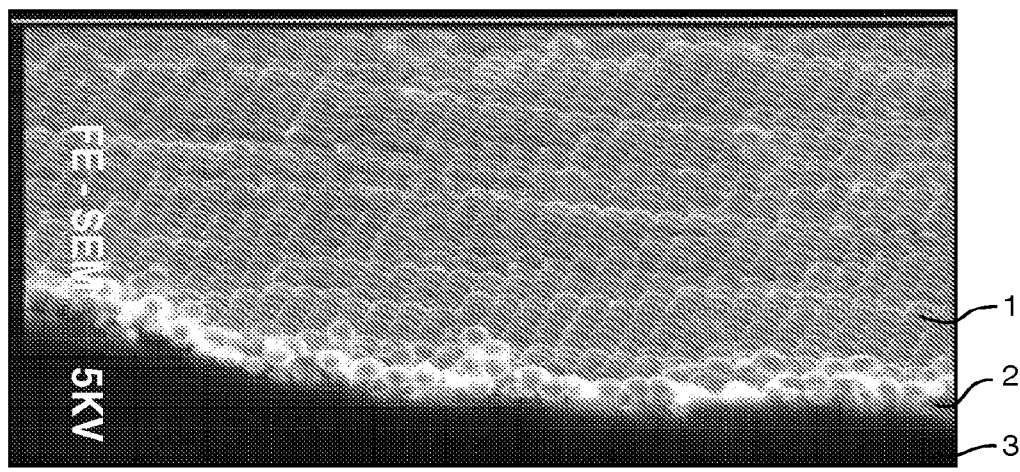
FIG. 1. Titania coated onto nano-hemispherical polycarbonate embossed template (scanning electron microscopy)
Figure 2A:
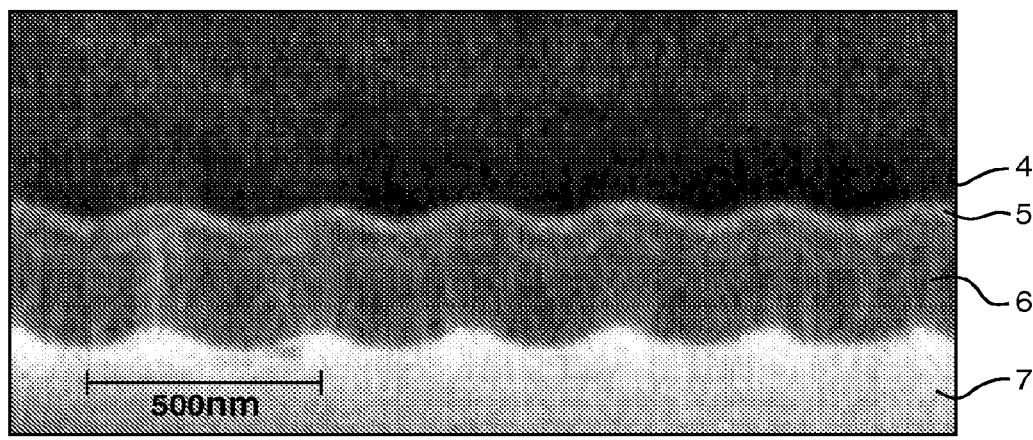
FIG. 2. Titania coated onto nano-cylindrical polycarbonate molded template (scanning electron microscopy of cross section)
Figure 2B:
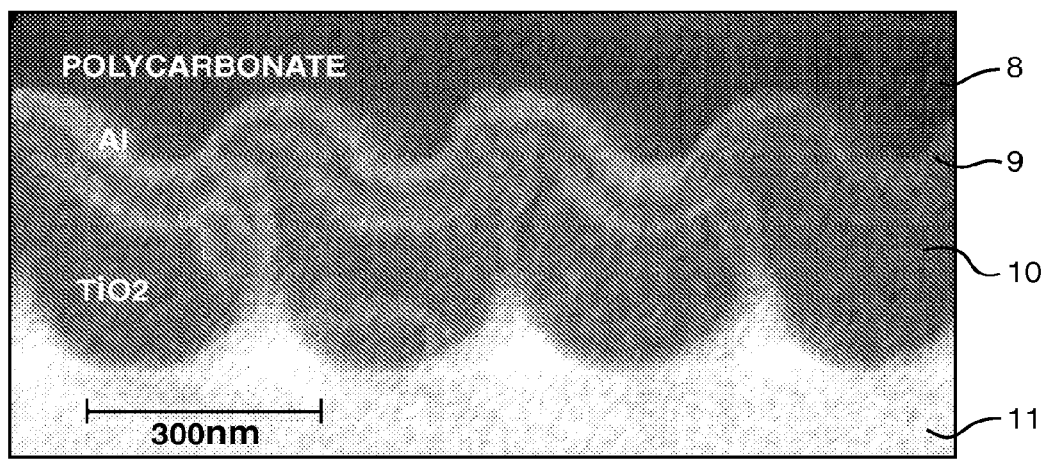

When tensile stress is applied to or caused in a semiconductor, the inter-atomic spacing increases directly. An increased inter-atomic spacing decreases the potential seen by the electrons in the material, which in turn reduces the size of the energy bandgap. The same effect occurs with increased temperature, because the amplitude of the atomic vibrations increases with the increased thermal energy, thereby causing increased inter-atomic spacing. The main feature of this invention, accordingly, is that the stress is carefully controlled to achieve the desired bandgap shift, and further managed to prevent delamination, by introducing periodic three-dimensional nano-scale surface features into or onto the substrate. These features act as a template such that the film that is grown onto the template takes on a similar shape. FIG. 1. is a scanning electron micrograph of a titania film 1 grown onto a polycarbonate template 3 comprising a close-packed three dimensional sinusoid surface 2, much like an egg carton, with a spatial period of 300 nanometers (nm) or 0.3 microns. FIG. 2A is a scanning electron micrograph of a cross-section of another polycarbonate template 4, in which the surface geometry comprises cylinders 5 with a spatial period of 300 nm, which result in stressed titania layer 6, which is immersed in air 7 in this figure. This is an example of a conformal coating, in which the undulations in the titania layer have the same shape and profile as in the substrate. FIG. 2B is a scanning electron micrograph of a cross-section of yet another polycarbonate template 8, in which the surface geometry 9 again comprises cylinders with a spatial period of 300 nm, but the peak to valley depth is larger than in FIG. 2A. This results in the titania coating 10 having a final shape that is more cylindrical than sinusoidal, an example of a non-conformal coating, which in turn changes both the stress characteristics in the film as well as the optical self-focusing characteristic. The titania coating 10 is facing a medium 11 that is air in this image, but for photoelectrolysis this would be an aqueous or hydrogen-bearing liquid.

Figure 3A:
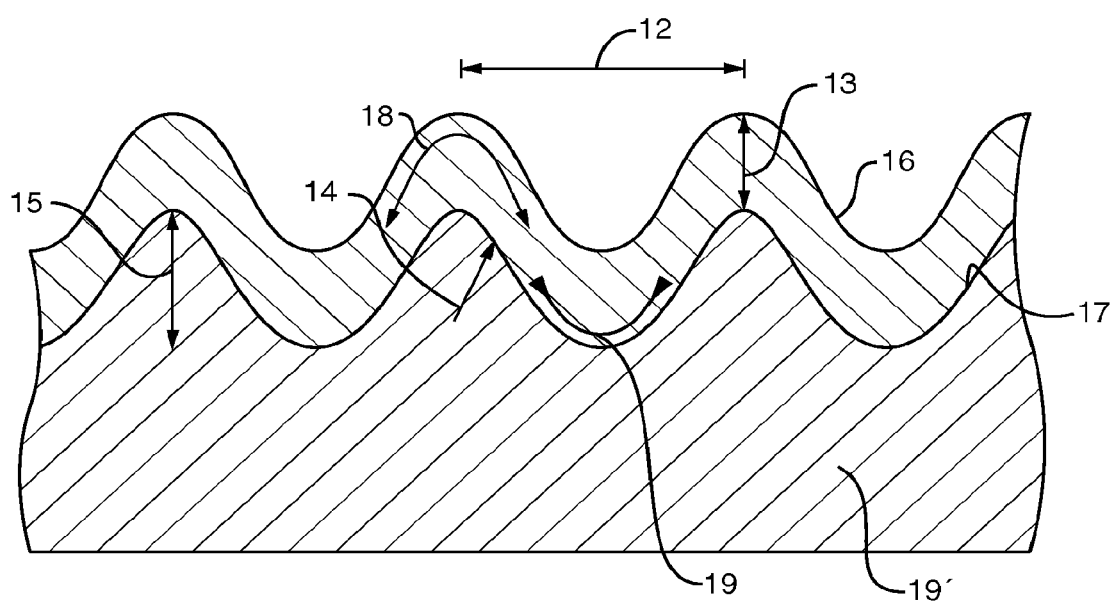
FIG. 3. Stress in coated layer
FIG. 4. Direction of illumination
FIG. 5. Photoelectrolysis cell
FIG. 6. One method of manufacture
FIG. 7. Stacked photoelectrolysis cells
FIG. 8. Vertical edge-illuminated cells
FIG. 9. Photovoltaic cell
FIG. 10. Photocatalytic surface
FIG. 11. Titania coated onto a fiber and a spherical particle.
Figure 3B:
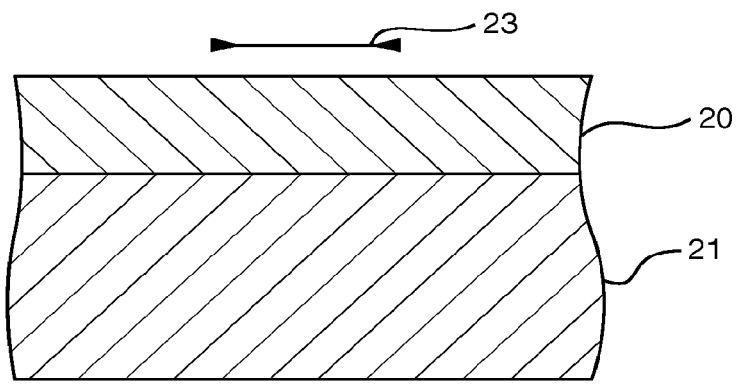
Figure 3C:
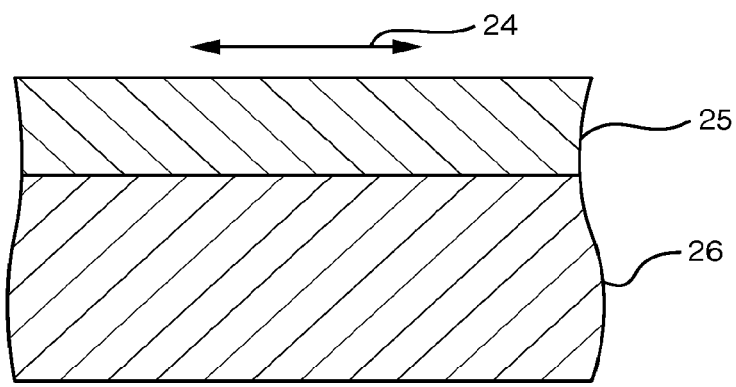
Figure 3D:
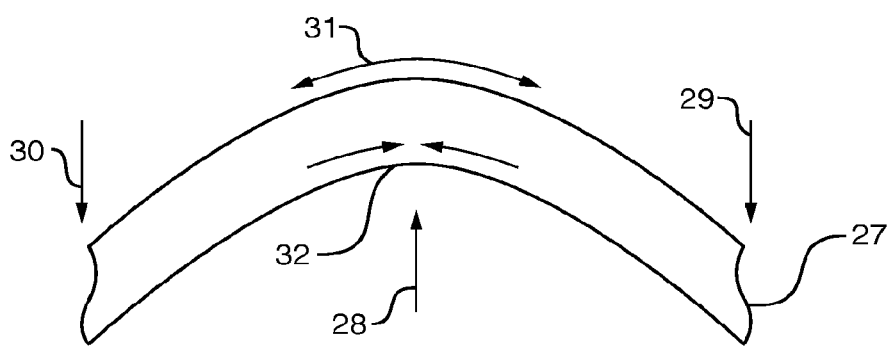

FIG. 3A. is a cross-sectional drawing of substrate 17' that is shown to have undulations 17 on the surface that transfer to the titania coating 16 applied by a vacuum technique. The titania coating has a film thickness 13 of about 200 nm, although it can be thinner or thicker depending on the coating conditions and the geometry of the substrate. As was seen in FIG. 2., the titania coating undulations can be made conformal, i.e. they follow the curves in the substrate exactly, or they can be made more like adjacent hemi-cylinders, with sharp cusps in between, depending on the coating film growth conditions and target to sample geometry, and the substrate undulation geometry: peak to valley height 15, radius of curvature 14, and pitch 12. For this figure the coating is shown to be conformal. For polycarbonate as the substrate material, thermal contraction of the polycarbonate 17' after coating is larger than for the titania thin film. The result is that very high stresses are formed in the titania layer: tensile stress 18 in the apex of the undulations, and compressive stress 19 in the troughs. Such compressive and tensile stresses are present in thin film coatings on planar substrates as well, depending on whether the substrate grows or shrinks, respectively, relative to the film after coating, and such surfaces are within the scope of this invention when applied to stress-induced bandgap shifting, particularly of titania. FIG. 3B is a cross-section of such a planar substrate 21 and titania coating 20, in which the stress 23 is compressive, and FIG. 3C. is a cross section of planar substrate 26 and planar coating 25 which is in tensile stress 24. FIG. 3D is a cross section of a planar film 27 that is bent by upward force 28 and downward forces 29 and 30, which results in tensile stress 31 and compressive stress 32. These bending stresses are the basis for the stress induction in this invention. However, the undulations in the preferred embodiment create much higher tensile stresses because of the introduction of very small localized bending radii 14 in FIG. 3A. In addition, the undulations provide a mechanical lock between the substrate and the coating, which allows the high stresses to exist without delamination. Other benefits of these undulations will be seen later in the description.

The resulting bandgap-shifted semiconductor, titania in the preferred embodiment, is then applied to photoelectrolysis for hydrogen production, photovoltaics for electricity production, and photocatalysis for detoxification and disinfection. Other semiconductors, including but not limited to strontium titanate, amorphous silicon, hydrogenated amorphous silicon, nitrogenated amorphous silicon, polycrystalline silicon, and germanium, and combinations thereof, will also exhibit a shift in their respective band-gaps toward a more favorable part of the solar spectrum with this applied stress.

Thin films, whether for optical, magnetic, semiconductor, or other application, and whether of dielectric, metallic, semiconductor, or other material, are typically inherently stressed as applied. Stress in thin films leads to delamination, also known as adhesion failure, and can also change the optical, magnetic, or electronic properties of the film. Therefore, stress in thin films is normally thought of as something to be managed or tolerated rather than as something useful. Stress is controlled by, and in this disclosure also meaning induced by, the following factors (this list not intended to be limiting or all-inclusive): (1) film thickness (2) rate of application (film growth) measured in angstroms/second (3) mean free path and vacuum level (4) e-beam energy (5) match of film and substrate mechanical and thermal coefficients (6) shape of the substrate on both a nanometer and macro level (7) target material from which the film is evaporated, (8) distance of the substrate to the source (tooling factor), (9) the presence or absence of mitigating layers, and (10) implanting ions during or after deposition to change the material and stress. Stress in the film can be made to be either tensile or compressive, and is induced also by bending. Stress in the film can also be photo-induced, especially if the film is self-formed into internally or self-focusing optics.

The films described here are contiguous thin films, rather than particles. However, it is known in the art than on a nano and micro scale all thin films exhibit some crystalline structure, particulate aggregation, and porosity. Also, small polymer or other particles can be coated with titania to form the stress shifting on a particle level, and these particles can be applied through, for example, a spray, or in a suspension applied by inkjet, or simply painting them on, suspended in a binder. Further, a titania coating can be applied to fibers, especially polymer fibers, to achieve the same stress-induced benefits. These fibers can then be woven into protective fabrics for garments, into air filters, or into paper for antibiotic envelopes.

Titania films can be formed with chemical vapor deposition, sol-gel, or vacuum coating, for example. With chemical vapor deposition, the material is deposited as an ash, which then coalesces into a contiguous film upon application of heat from, typically, a gas flame. Sol gel coatings have the titania particles in a solvent that is spun coated or dipped or otherwise applied to a substrate. If the solvent is driven off, the film that remains is a porous matrix of titania particles. This is done typically for the dye-adsorbed solar application of titania. The film can be several microns thick, and the dye within the porous cavities increases the amount of surface area for interaction. If this film is baked, the titania particles will coalesce into a reasonably contiguous film.

While it is possible to induce the required stress with the above coating approaches, thin film vacuum deposition is preferred for inducing the highest stress and with the lowest amount of material. Typical vacuum deposition methods include sputtering, electron-beam, and ion deposition, for example. My earlier work with these structures, which at this size are nano-optics, for the application of increasing optical data storage density, has shown that they indeed focus incident light and increase the power density at their focal plane (rigorous electromagnetic modeling, thermal finite element modeling, and empirical results with phase change materials placed at the focus plane all corroborate this). Further, their sinusoidal to cylindrical shape naturally gives rise to significant tensile stress. The invention disclosed herein is that one or both of these factors are causing the bandgap to drop to a level at which spontaneous photoelectrolysis of water can occur in a spectral region that is abundant in sunlight. Stress in thin films can be controlled by a combination of film thickness, substrate-to-film match or mismatch of thermal and mechanical coefficients, micro or nano-scale shape, and by the addition of other thin films.

While there is certainly a benefit to having the stress-inducing shape perform also as a light concentrator, it will be clear that other stress-inducing template profiles may be used, even if they do not also act as light concentrators.

Stress in thin films can be as low as 2 MPa, but is more typically up to 100 MPa, and can reach into the GPa's depending on the coating conditions, the thin film or thin film stack, and the substrate (the SI stress unit is the Megapascal, or MPa, and is equivalent to the English stress unit of pounds per square inch, or PSI; GPa is Gigapascal, or one billion pascals). The stresses can be so high that a thin dielectric film only a couple of hundred nanometers thick can cause a substrate as thick as a millimeter to be noticeably distorted by bending, and in fact this distortion is used to monitor stress optically by observing deflection of light from such a bending substrate during coating.

The stress in the thin film a can be expressed to first order as the intrinsic film stress $\sigma_i$ caused by the coating conditions plus stress $\sigma_e$ from an external bending force F (in Newtons N):

$$\sigma = \sigma_i + \sigma_e \quad (3)$$

where it is assumed that the Young's moduli of film and substrate are equal. However, additional stress can be induced in the thin film when Young's moduli of film and substrate are decidedly unequal. Moreover, if the substrate/film interface is undulating on a spatial scale of the same order of magnitude to the thickness of the coating, such unequal moduli result in significant bending forces on the film. The relation of the external stress $\sigma_e$ to the bending force F is:

$$\sigma_e/F = 12 \text{ MPa/N} \quad (4)$$

It can be seen from equation (4) therefore, that even small external forces are leveraged into large stresses in the film. A film of titania only 125 nm thick, deposited on a thick polycarbonate substrate having a surface embossed or otherwise formed into a sinusoidal, hemispherical, or hemi-cylindrical geometry with a spatial period of 370 nm, can experience stress in the GPa range and higher, sufficient to significantly alter the bandgap. Such stresses in planar thin films can cause the films to crack and even delaminate from the substrate, where in the compressive stress case the film behaves much like the earth's crust in plate tectonics, and literally explodes away from the surface, leaving a gaping crack (FIG. 9a in Guerra, "Photon Tunneling Microscopy Applications"). In the tensile stress case, the film pulls away from itself, leaving a crack in the coating that scatters light (FIG. 8b in Guerra, "Photon Tunneling Microscopy Applications"). Scientists in the thin film coating world usually strive to reduce stress in thin films, accordingly. However, it is recognized that some level of stress will always be present in a thin film, and so when stresses cause delamination, they refer to this as adhesion failure, in recognition that controlling and increasing adhesion between the layer and the substrate will allow the layer to remain intact in the presence of modest internal stress if the adhesion is high enough. In this invention, the corrugated substrate not only causes the film to be in a highly stressed state, but also locks the film to the substrate and prevents delamination, even though in a highly stressed state.

As was seen in FIG. 3., titania at the apex of the sinusoidal geometry experiences tensile stress, while the titania in the trough of the sinusoid experiences compressive stress. For the applications of photoelectrolysis, detoxification, and disinfection, this means that the desired photocatalytic activity is induced in the titania at the part of the surface (apex of the sinusoid) closest to the object of photocatalysis. Because the stress varies continuously from tensile to compressive, the bandgap is not only shifted but broadened as well. Further, more of the film is in a beneficially stressed state than would be the case for a bulk form of the titania, where the stress would be largely near the surface and a comparatively much smaller percentage of the bulk volume of the semiconductor.

Figure 4:
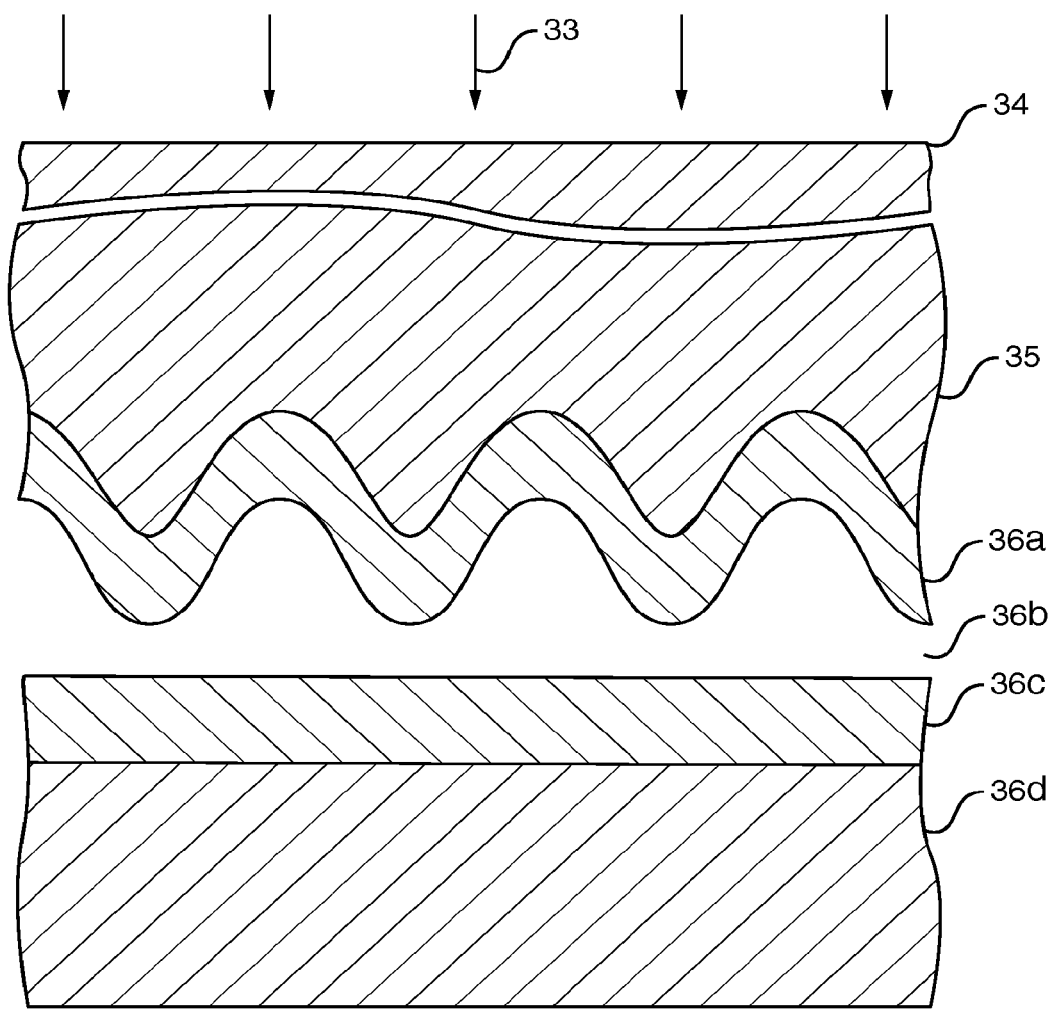

The description of an illustrating experiment and results follows, and is shown in FIG. 4.

It is known that the bandgap of a semiconductor can be markedly decreased by (1) applying tensile stress and/or (2) elevating its temperature. In fact, in semiconductor devices this is known as "package shift", in which for example a bandgap reference is shifted in voltage after packaging in plastic, from the package-induced stresses resulting from the thermal coefficient mismatch between the encapsulating plastic and the silicon device. Unlike that example, however, in which the effort and desire is to reduce the stress and resulting bandgap shift, herein the shift is a beneficial effect that one would like to amplify and control. So, one would like a surface coated with $TiO_2$ that applies tensile stress to the $TiO_2$ layer (and perhaps elevates the temperature as well). For this photoelectrolysis application, $TiO_2$ 36a was coated onto a polycarbonate surface 34 into which had been formed, by molding replication from a nickel stamper, undulations 35 in the form of sinusoidal to cylindrical profiles. The $TiO_2$ grows on this template shape during the vacuum coating process to form lenses. For this experiment the lenses happened to be cylinders arranged in a continuous spiral track, with the pitch of the cylinders, and therefore their width, being 370 nm. The polycarbonate substrate is 0.6 millimeters thick, and the titania film is 210 nanometers thick.

The experimental apparatus comprised a Nikon optical microscope with a tungsten-halogen 50 W light source. A 40×0.6 numerical aperture (N.A.) objective focused the light 33 down to the polycarbonate substrate 34, with the planar surface facing the microscope. The corrugated surface (370 nm pitch) coated with the 210 nm thick $TiO_2$ faced a first-coated aluminum 36c on glass 36d mirror. Tap water 36b was dripped into the interface, forming and aluminum/water/$TiO_2$ sandwich. Focus was adjusted to cause the brightest back-reflection, and then the experiment was visually checked periodically through the microscope.

After an elapsed time of 10 minutes, bubbles were observed inside but near the edge of the illuminated field. These bubbles rapidly increased in number over the next few minutes until they began to merge. Eventually, the merged bubbles created a zigzag geometry similar to that observed when free surface coatings de-wet from the surface. The orientation of the zigzag stripes were observed to be perpendicular to the cylinder axis, and this repeated in subsequent experiments. This zigzag pattern is also consistent with modeled bandgap change in strained semiconductors (Yang).

At lower power, Newton fringes were observed on a larger scale surrounding the zigzag pattern, which was limited to the field of view. These fringes indicated a convex bulging distortion of the sandwich, caused by gas pressure.

With a green filter (540 nm) in place, the experiment did not repeat, thereby placing an upper limit on the degree of bandgap shifting in this case. The lower limit was determined by measuring the spectrum of the illumination at the focus of the microscope with an Ocean Optics spectrophotometer, which showed no significant illumination below 490 nm, and therefore one would not expect any photocatalytic action to be observed in the titania, which requires illumination of about 390 nm wavelength because of its 3.0 eV bandgap.

In the flat $TiO_2$ coated areas of the same disc (i.e., where there are no corrugations), nothing happened even after hours of exposure. Similarly, nothing happened with $TiO_2$ coated glass witness samples. This indicates that the corrugated surface profile is necessary, whether for the tensile stress or the optical temperature elevation it causes, or both.

Other lensed surfaces were tried. GaP and $ZnS/SiO_2$ showed no activity after hours of exposure, indicating the semiconductor bandgap property of $TiO_2$ was required.

Other thickness $TiO_2$ coatings showed various results. At 190 nm, no activity was observed. At 230 nm, activity was observed but took longer. This is consistent in that the stress in an optical thin film is dependent on, among other parameters, the film thickness. However, this may indicate that the optical focusing is also important, along with the temperature elevation associated with optical focus.

That the activity was restricted to the area inside the field of view indicates that this is in fact a light-driven process.

The spectral output at the focus of the microscope is similar to sunlight, with no significant radiation below 490 nm wavelength. The power output at the focus, measured with a Newport photodiode with peak sensitivity at 520 nm, was 0.1 Suns.

The same sandwich was placed in sunlight, with a mask covering a portion. Once again, bubbles were observed even by eye and subsequently under the microscope, and the bubbles stopped at the edge of the mask.

It should be noted that no attempt was made to make the $TiO_2$ a conductive n-type semiconductor, as was done in earlier studies, by heating to drive off oxygen (although, such films on planar glass, typified by their blue color, did not work here). Also, the water was just tap water, and not intentionally an electrolyte such as $H_2SO_4$ or NaOH. Further, no attempt was made to contact the anode to the cathode to complete the cell. There may also have been an aluminum oxide overcoat on the aluminum mirror. Any dissolved oxygen in the water was not purged.

In the prior art discussed in the Background, when titania was used as the photocatalyst, it was typically in the rutile form, and n-type, and was a wafer cut from a rutile crystal. Others have used hot pressed titania in a polycrystalline form, and others have used the anatase form, reporting a slightly better efficiency. No one is disclosing the use of titania in the form of a vacuum deposited thin film, and no one is disclosing thin films of titania deposited onto plastic substrates with or without corrugations on the surface. In such a vacuum deposited thin film of titania as is being disclosed herein, the film can have several material states: polycrystalline, amorphous, anatase polymorph, and rutile polymorph. How many and what kind of states exist and coexist in the film, and in fact even the stoichiometry, are determined by how the film is deposited (e.g. e-beam), what substrate it is deposited onto, and what conditions were used in the coating process (substrate temperature, deposition rate, pressure, and starting target, for example). These same conditions also control the level of stress in the film. For example, titania films deposited with e-beam evaporation are typically amorphous, with higher refractive index n than with titania films deposited by, say, ion assisted deposition. On the other hand, energetic ion- and plasma-based deposition produces denser titania films that are also less rough than those deposited with e-beam. It is further known that substrate temperatures above 380° C. result in polycrystalline titania films of primarily the rutile phase, while substrate temperatures of between 310° C. and 380° C. produce polycrystalline titania with both anatase and rutile phases. Titania can be formed with a TiO or even Ti target and oxygen bleed-in during the deposition, and this reactive evaporation results in predominantly rutile titania, while starting with a $Ti_3O_5$ target results in anatase titania. Other features of the titania film, such as density, roughness, resistance to water adsorption, and stress are also highly dependent on the starting target material. For example, the $Ti_3O_5$ target is chosen because films made from it are lower stress, which is not a desirable feature in this application. Optical absorption is another property controlled by the starting material, and is reduced by a factor of 10 with TiO as the target material, and by a factor of 100 with $Ti_2O_3$ or $Ti_3O_5$ as the target. Of course, the science of coating, and in particular the coating of titania films, is very complex and not completely predictable, and is largely outside the scope of this application. Nevertheless, it should be recognized that this invention includes titania films formed by a number of different coating techniques, coating parameters, and starting materials. The discussion included here is only to indicate some of the controls that are available and possible to form titania with a specified material state or states.

Figure 5:
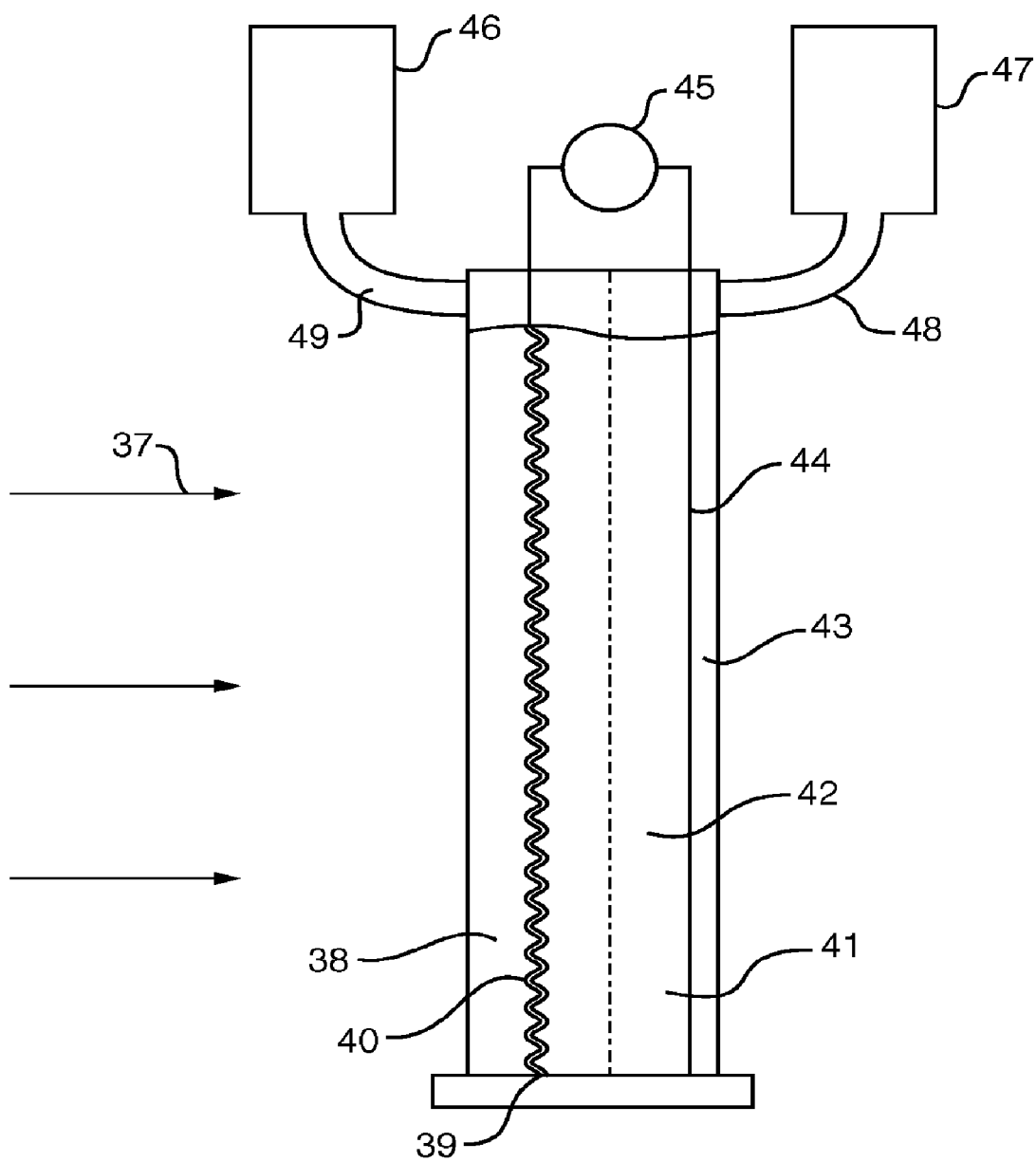

FIG. 5 is a cross-sectional drawing of a complete photo-electrolysis cell employing stress-induced band-gap shifted titania as one of the electrodes. Light 37 illuminates the polycarbonate substrate 38 that also comprises one side of the cell. The polycarbonate has a distal surface 40 that has been embossed with undulations as have been described in this specification, and coated with titania 39. The second half of the cell is provided by wall 43, which may also be polycarbonate but can be other materials as well. The second electrode 44 is aluminum, platinum, or aluminized thin film coating on a substrate, for example. A separator membrane 41 is shown, to allow the hydrogen and oxygen gasses released in photoelectrolysis to be collected separately. Further, this controls the amount of dissolved oxygen that is present in the water, to make the photoelectrolysis reaction more efficient and predictable. An optional bias voltage source 45 is shown connected to the electrodes to adjust the redox potential for best electrolysis efficiency, but a redox-mediating electrolyte can also be used to reduce hole/electron recombination if necessary. Reservoirs 46 and 47 collect the separated hydrogen and oxygen gases.

Figure 6:
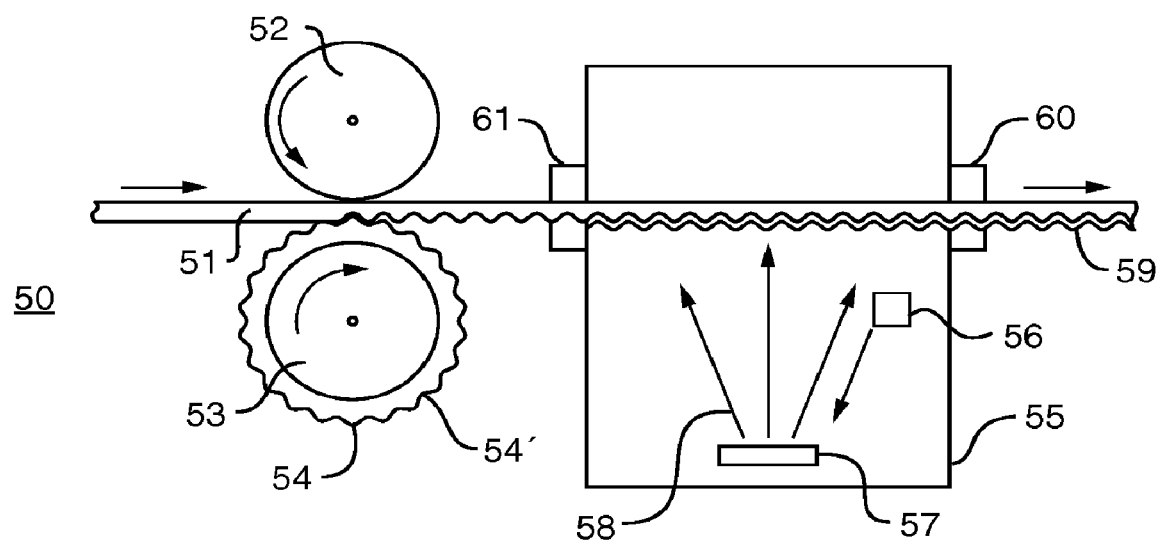

In FIG. 6., one method of manufacture is shown in which a polycarbonate substrate 51 is delivered from roll 50 into an embossing machine, in which a stamper 54 containing the desired undulation shape and pattern 54' and wrapped around roller 53, is embossed into the polycarbonate using known embossing techniques that may include heat and/or solvents to varying degrees. The stamper is typically a nickel replica grown from a master. The master is typically a photoresist or photoablative polymer on a glass or silicon substrate, into which has been formed the desired undulations by one of the following methods: contact lithography, projection lithography, interferometric lithography, or laser beam recording. Finally, the embossed polycarbonate web is coated in a vacuum chamber 55 with e-beam 56 (preferred method), sputtering, ion-assisted deposition, or thermal evaporation, from a target 57. Material 58 from the target then deposits onto the web. The result is that the polycarbonate emerges from the chamber coated with, in this example, titania 59. In this simplified drawing, provisions 60 and 61 are shown to maintain vacuum lock on the web, but the entire roll can be in the coater as well. Sol gel or chemical vapor deposition are also possible means of coating. Also, instead of roll manufacture, the polycarbonate substrates can be injection/compression molded to the stamper. All of these techniques are known in the optical data storage and other industries, but their application to this invention is new. The fact that band-gap-shifted titania can be manufactured with existing infrastructure in low-cost mass production methods enhances the value of this invention, because any solar energy conversion application requires large area devices with low-cost.

Figure 7:
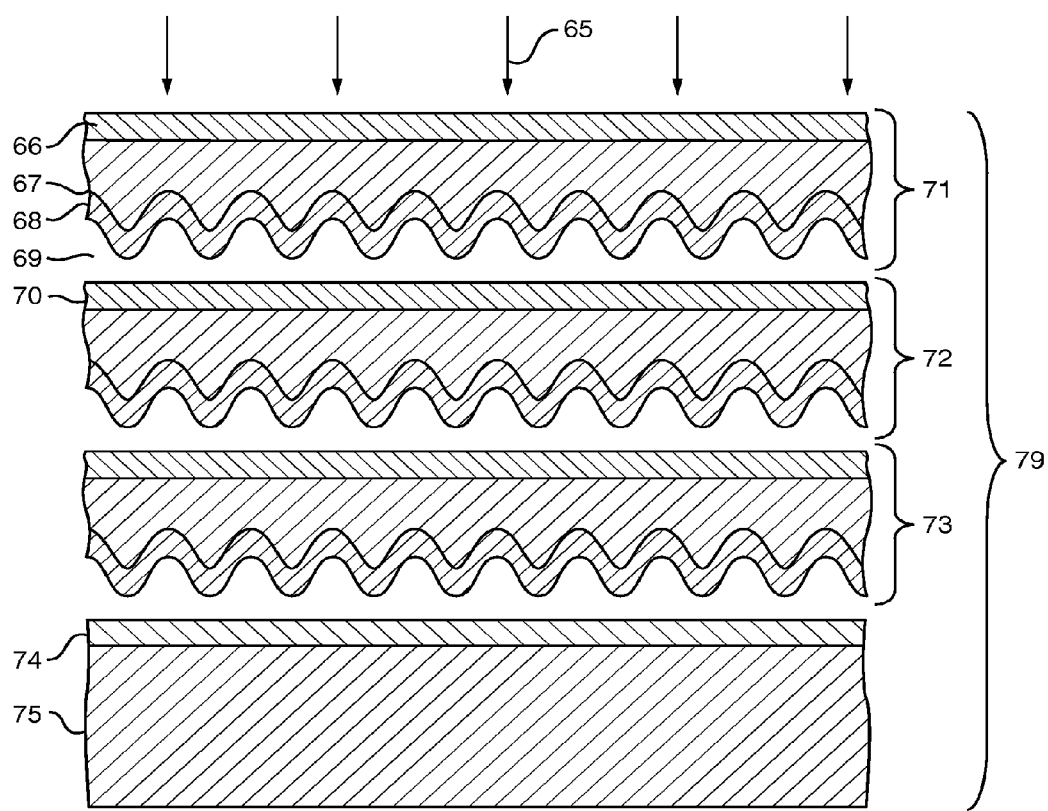

FIG. 7. is a cross-sectional illustration of a multi-layer device 79, comprising individual cells 71, 72, and 73, in which the conductive anode or cathode is not aluminum or platinum, but transparent indium tin-oxide (ITO) 70. In this way, a single web 66 is coated with ITO 70 on the incident flat side and $TiO_2$ 68 on the corrugated anode side 67, and then this web is cut up and layered so that the water 69 can flow, or at least wick or capillary, between the layers. The final bottom surface 75 is metallized with aluminum 74 or other high-reflectance metal. Also, the edges of the films may be connected electrically with aluminum or platinum or other metallized mount, although that is not shown here to preserve clarity. Photoelectrolysis occurs when light 65 from, for example, the sun, illuminates the cell. Means for collecting the hydrogen gas are not shown here.

Figure 8:
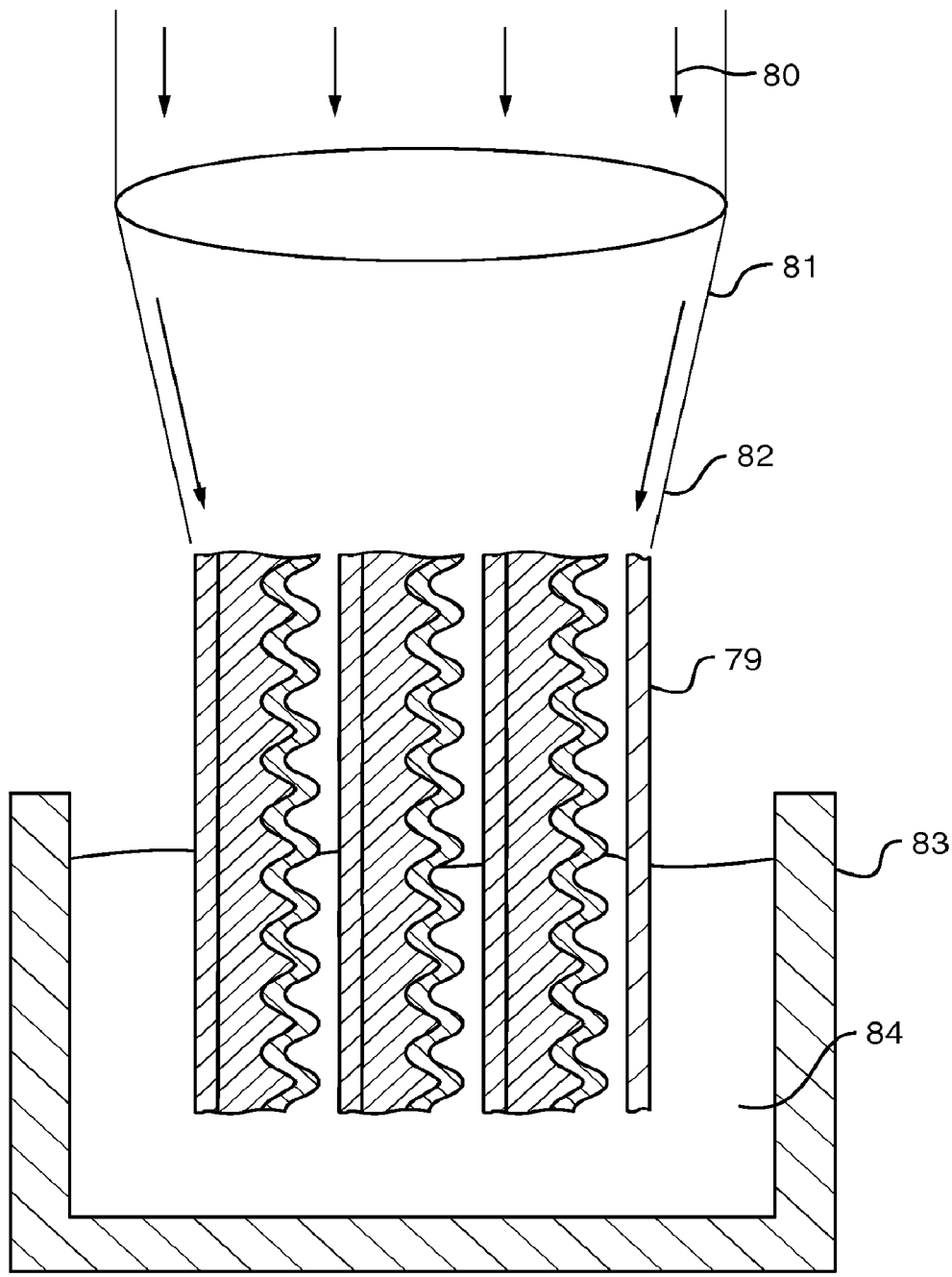

In another embodiment, the $TiO_2$ corrugated sheet anodes are arranged vertically in parallel in a tank or cell, with the light coupled in from a common concentrator via total internal reflection wave-guiding (edge illumination) within the anode. FIG. 8 shows the same multi-layer device 79 but arranged to be vertical in a tank 83 of aqueous solution 84, and for which the light 80 required for photoelectrolysis is focused or concentrated by lens 81 into a cone 82, which then couples into the edge of the multi-layers and travels down the titania surface via optical wave-guiding. Lens 81 is intended to be generally representative of light concentrating optics, and can also be a Fresnel lens or a mirror, for example.

Figure 9:
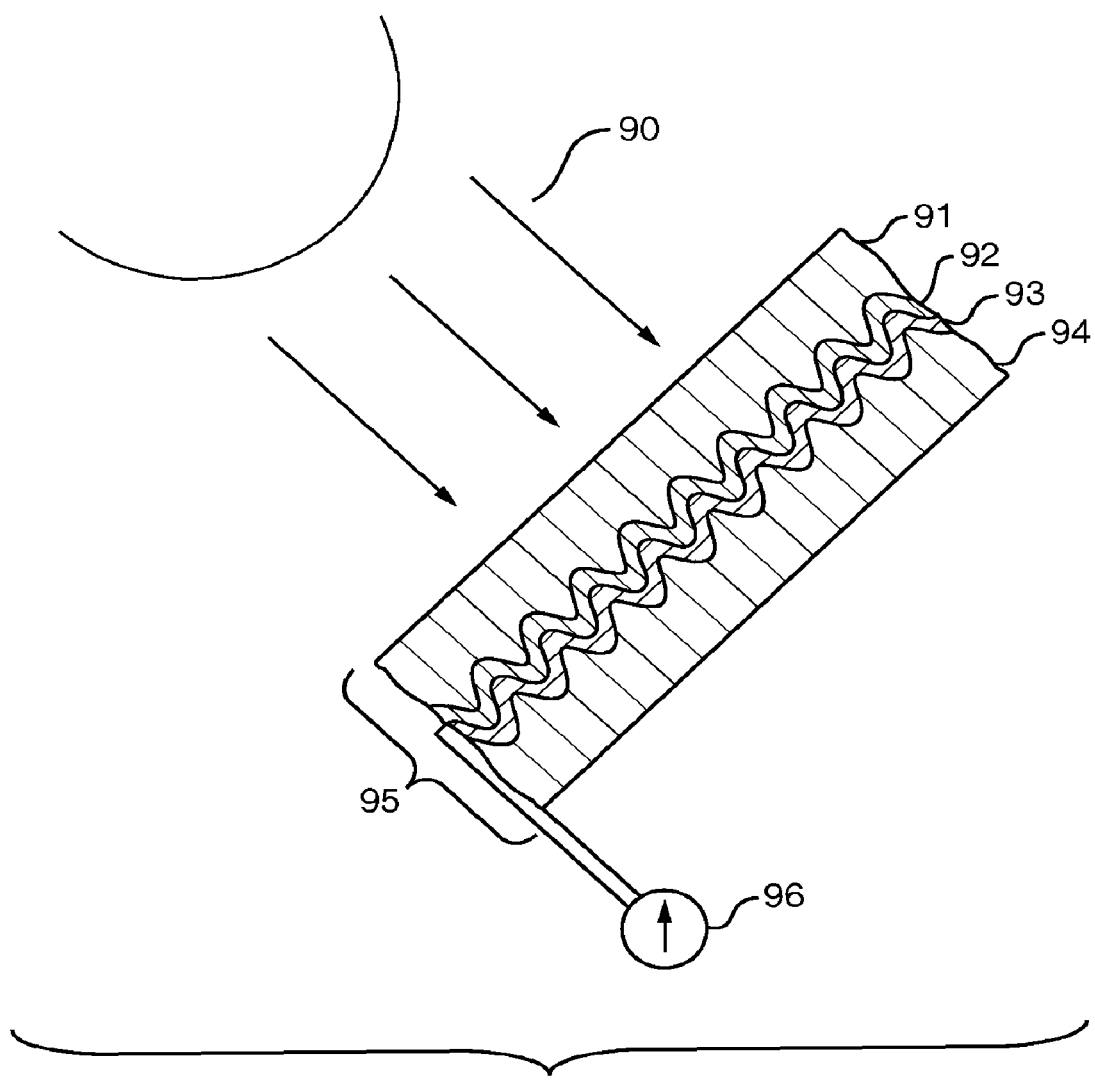

FIG. 9 is a cross-sectional view of a solar photovoltaic cell 95 that uses titania whose bandgap has been shifted into the more abundant part of the solar spectrum, by employing stress as taught in this invention. Light 90 from the sun is incident onto a polycarbonate cover 91, which has the stress-inducing undulations. A transparent indium tin oxide (ITO) conducting layer 92 is first applied to the polycarbonate, which is then followed with the titania layer 93 and conducting backplane 94, producing voltage V 96.

Figure 10:
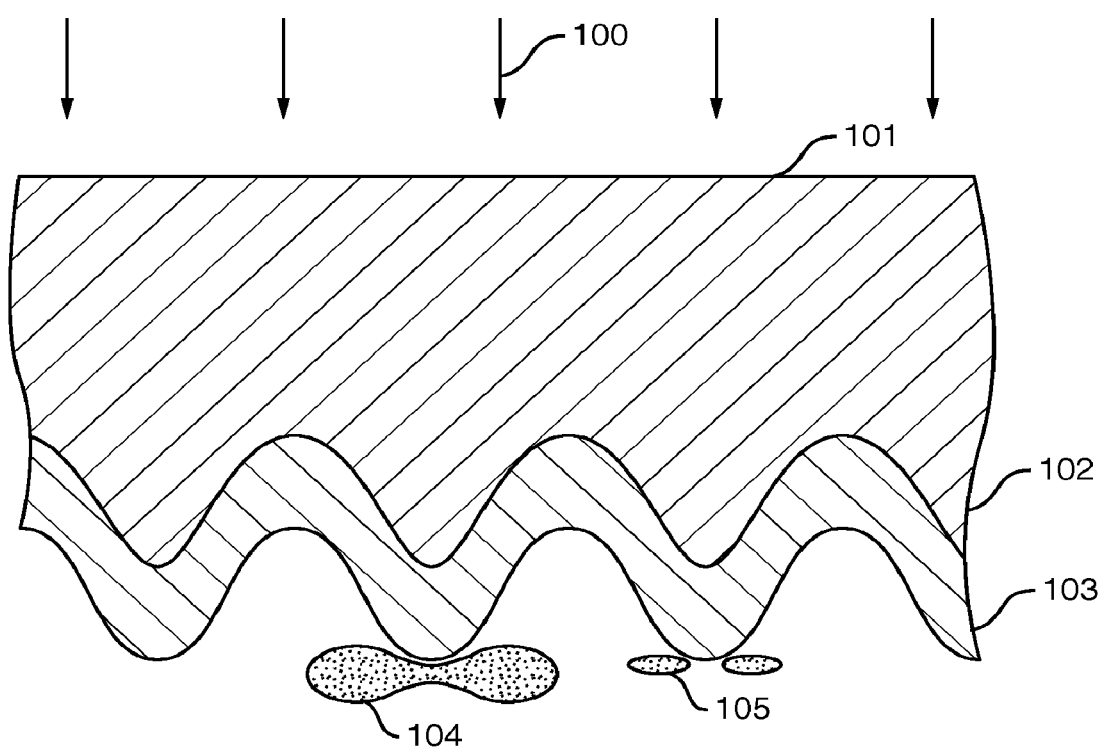

Also within the scope of this invention is the use of this same photocatalytic effect, combined with and enhanced by our template grown photocatalyst with stress-induced band shifting, for the application of detoxification and/or disinfection. In these applications, shown in FIG. 10., harmful toxins or germs and bacteria 104 are reduced to harmless compounds 105 through oxidation by the following process: when a photon 100 of the required energy strikes the titania ($TiO_2$) 103, an amount of energy equal to the bandgap of the semiconductor is absorbed. This results in an electron from the valence band of the semiconductor being pushed up into the conduction band resulting in formation of an electron-hole pair. The hole accepts an electron from an adsorbed $OH^-$ ion resulting in the formation of $OH°$, i.e., an OH radical. This free radical is an extremely powerful oxidizing agent, and can oxidize most organic compounds that come into contact with the photocatalytic surface. With the titania bandgap lowered through this invention, i.e. undulations 102 in polycarbonate substrate 101, detoxification and/or disinfection will occur more efficiently in visible light, whether artificial or sunlight.

Figure 11A:
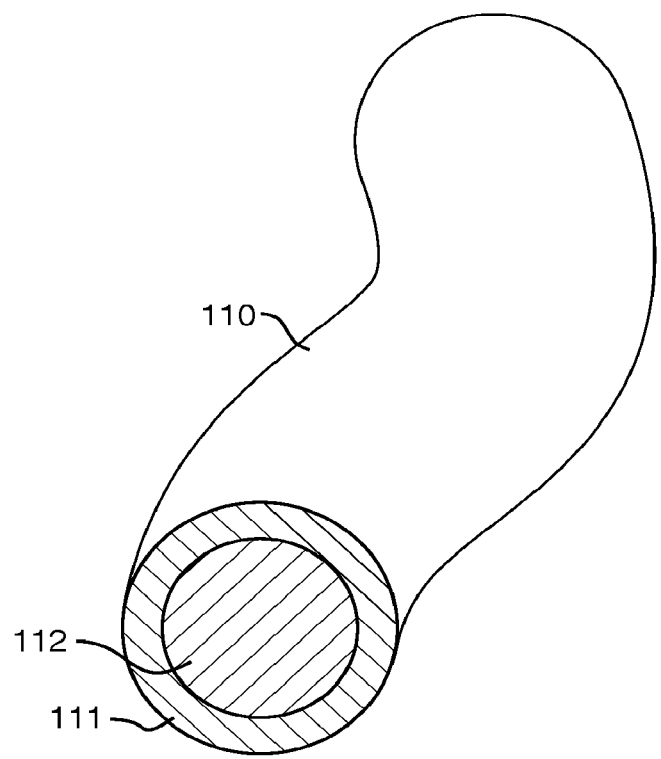
Figure 11B:
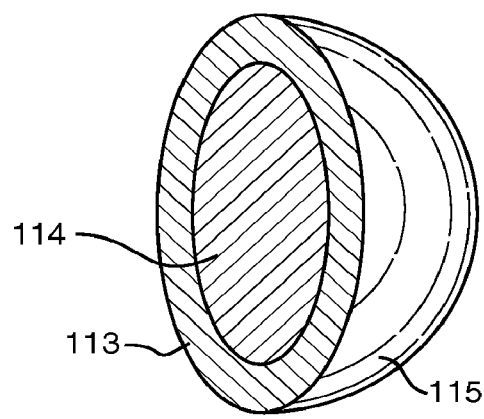
Figure 12:
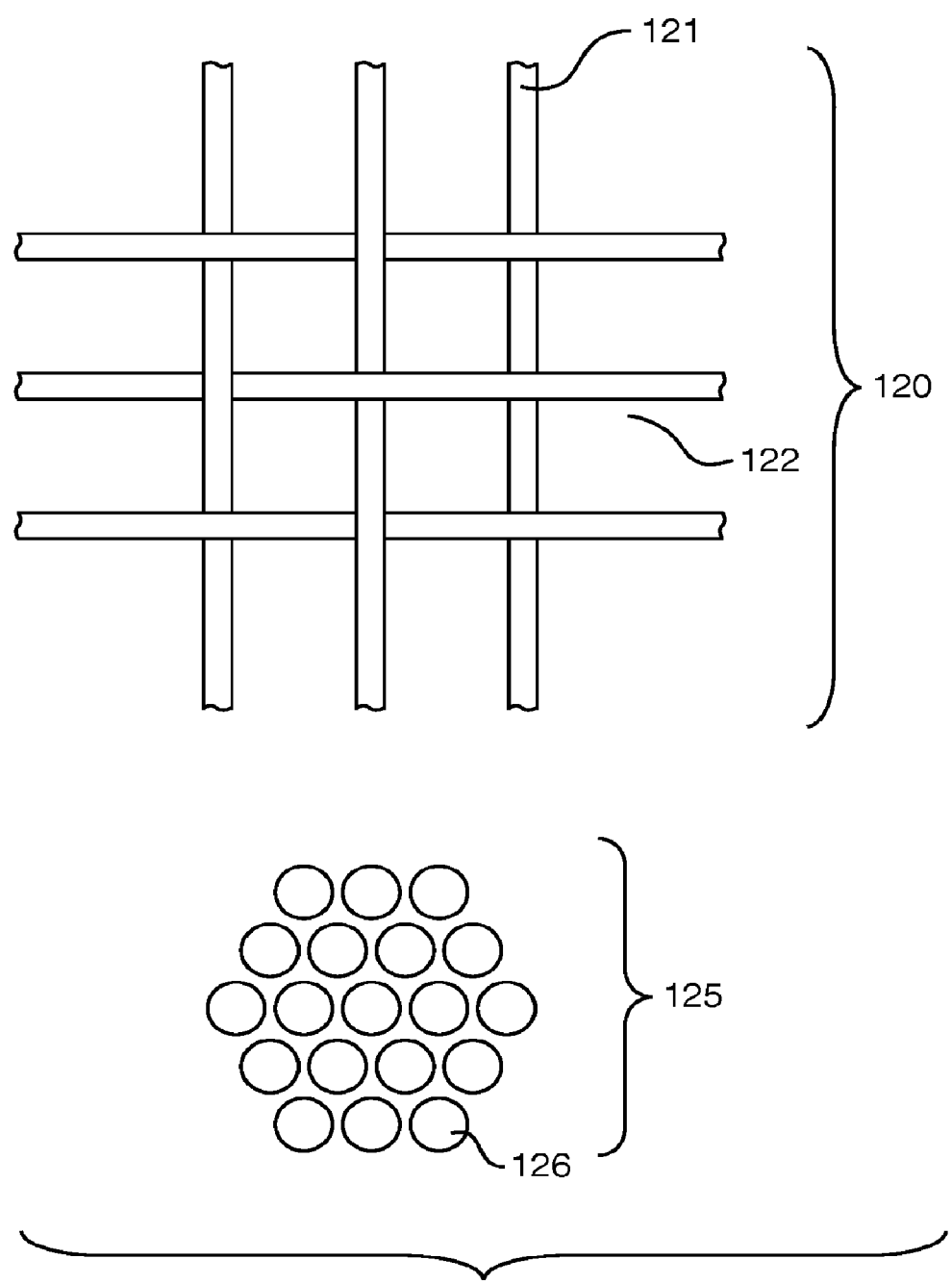
FIG. 12. Fibers and spheres arranged as fabric and filters
FIG. 13. Point-of-use photoelectrolysis schematic
FIG. 14. Detail of point-of-use application.

FIG. 11A. illustrates an extension of the invention in which the substrate is a polymer fiber 110 with circular cross section 112 coated with titania 111. And FIG. 11B illustrates an extension of the invention in which the substrate is a polymer sphere 115 with circular cross-section 114 coated with titania 113. In both cases the titania thin film, because of the curvature of the substrate and the thermal mismatch between the substrate and the titania film, is highly stressed, as in the case of the corrugated substrate before. In FIG. 12, a multitude of titania-coated polymer fibers 121 and 122 are woven or otherwise assembled into a fabric 120 for protective clothing, in which the bandgap shift is used for photocatalysis, disinfection, or detoxification. Or, the fibers can be woven into filters for air and water purification, or into paper for, say, envelopes that are easily and effectively disinfected in the presence of light. Similarly, the titania-coated polymer spheres 126 can be assembled into a filter mesh 125, or can be sprayed or otherwise applied to clothing and other surfaces for passive disinfection and detoxification in the presence of light.

There are other benefits that this photoelectrolytic surface, with its nano-optics formed by and embedded into polymer surfaces, brings to any conversion of solar energy.

First, the cost is low because the technology exists now for embossing and coating acres of polymer web at very high rates of speed. The semiconductor material is very thin and therefore contributes very little to the cost. The simple one-layer structure cathode, without more exotic and costly semiconductors, also keeps down the cost, although even multi-layer semiconductor structures would still be inexpensive with this method.

Second, this process easily makes continuous large sheets with no "dead" areas, and in solar conversion detector area is paramount.

Third, the focal surface is corrugated, so that the effective active area is even larger than the projected footprint area, by a factor of about 1.4× for sinusoid cylinders, and 2× for hemispheres.

Fourth, the corrugated substrate causes the film to be more robust by providing mechanical locking, and so prevents the cracking, crazing, and delamination common to other coating of plastic, and allows the film to exist in a highly stressed state.

Fifth, there is no need for tracking mechanism because the nano-optics have a large angular field of view, and can keep the sun focused on the interface over much of the day.

Sixth, the materials are not toxic, and have long lifetimes if a U.V. resistant polymer is chosen.

Seventh, the substrate is very thin and pliable, and is easily rolled up into a compact volume for unfurling later in space deployment, for example.

Eighth, the concentrated light makes for better performance of the semiconductor under low light conditions, where normally low light conditions allow the electron and hole pairs to recombine. Yet, the concentration, in the vicinity of 10 suns, is not so much as to cause charge saturation.

Ninth, the corrugations can be designed with a pitch to wavelength ratio for which light at that wavelength is very efficiently absorbed, as in photonic bandgap crystal-type antireflection coatings, for higher efficiency. In this case, the pitch of the surface template profile is designed to increase solar absorption and decrease solar reflection. The geometry can then considered to be a 2D photonic bandgap crystal. Also, the pitch, when sub-wavelength, causes very low scatter loss.

Alternately, the thickness of the titania itself can be chosen to be a quarter wavelength antireflection filter for the predominant wavelength of the bandgap. If stress is not sufficient for this thickness, the template profile or deposition conditions or substrate thermal/mechanical coefficients may be altered accordingly.

Devices utilizing this photoelectrolytic surface provide hydrogen directly for the coming hydrogen-based energy world, and also provide a way to convert solar energy into a form that can be stored, i.e. in the form of hydrogen. In addition, the simple and low-cost implementation is well suited to help energy-impoverished third world countries.

Finally, the clean desalinated water that results from local power generation with fuel cells fueled by the photoelectrolysis can be used for crop irrigation and other human consumption.

While the primary illuminant considered to this point has been the sun, and the primary benefit the use of free sunlight to passively produce hydrogen gas fuel, clean and desalinated water, and detoxification, via stress-induced bandgap-shifting of titania, in particular, to be photoactive in the solar spectrum, there is merit in using other illuminants as well.

For example, for the application wherein stressed titania is woven into fabrics, envelopes, and other surfaces for detoxification and disinfection, artificial illuminant sources that are rich in blue light but less so in ultraviolet, such as xenon flash lamps and xenon continuous light sources, are more efficiently used than with titania in an unstressed condition.

Figure 13:
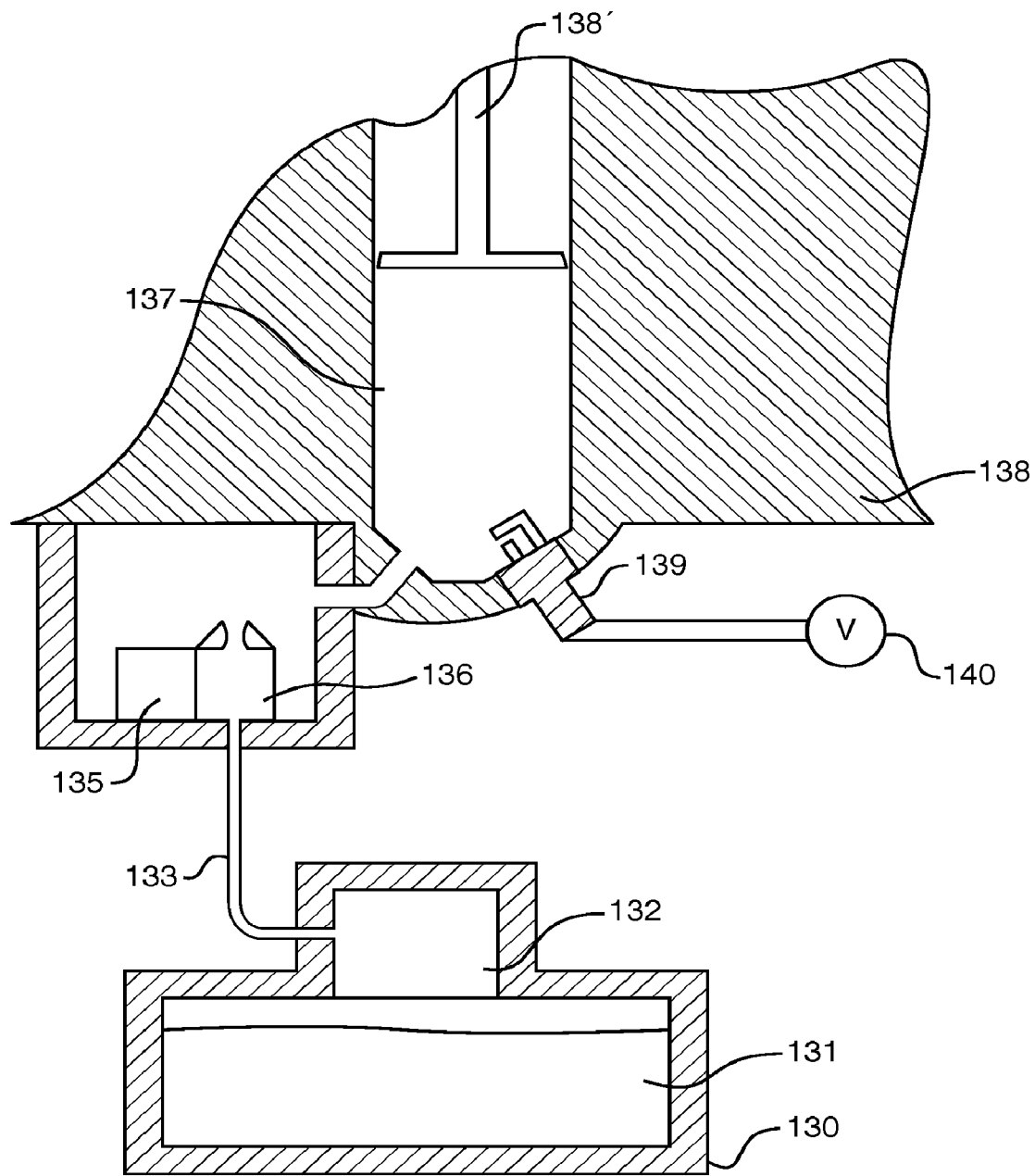

Another important artificial light source is the blue laser diode. Lifetimes of blue laser diodes have improved to commercial levels, and their brightness has increased, while costs have gone down. Shorter wavelength blue lasers, however, still have lifetime, brightness, and cost problems. And ultraviolet laser diodes do not yet exist. Combining the blue laser diodes with the present invention, however, makes possible point-of-use photoelectrolysis. FIG. 13 shows a schematic for point-of-use photoelectrolysis, in which a blue laser diode 135, or diodes, illuminates a stress-induced bandgap-shifted titania photocatalyst 136, such that a small injected stream of water or other aqueous solution 131 delivered by fuel pump 132 from fuel tank 130 is dissociated into hydrogen and oxygen gas by the laser-illuminated titania 136, where it can be used directly in the cylinder 137 of an internal combustion engine, shown partially as 138. Ignition is provided by spark plug 139 and high voltage 140, with the resulting combustion of the hydrogen in the cylinder drives the piston 138'. The energy for the laser diode can be from batteries recharged by braking, as is done today with hybrid electric/combustion cars, or just from the alternator recharging if the efficiencies work out to allow this. A holding tank 134, or "capacitor," would likely be an advantage and would allow sufficient hydrogen to build up before release into the cylinder, or else additional laser diode and titania photocatalyst combinations could be employed.

Figure 14:
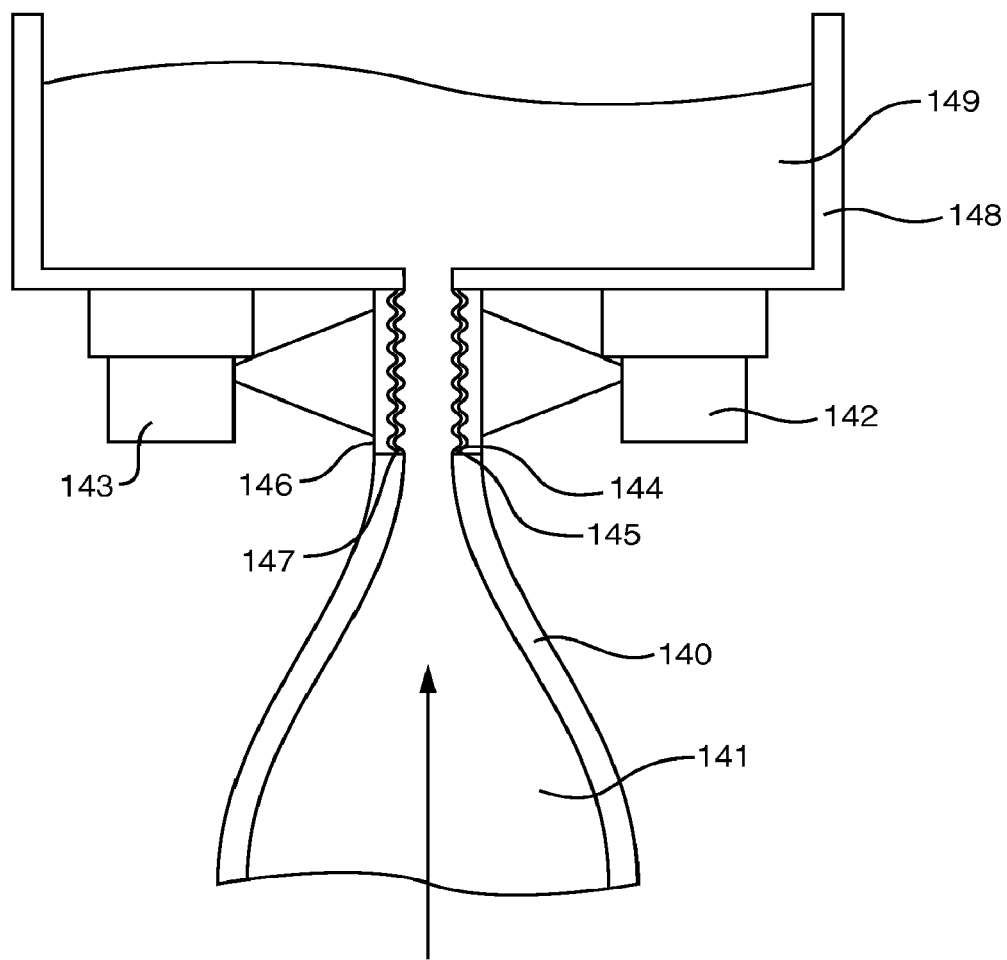

A detailed view of one way to combine the photodiode and the titania photocatalytic surface is shown in FIG. 14. Water 141 is injected into and between titania photocatalytic surfaces 145 and 147 on substrates 144 and 146, respectively. Blue laser diode 142 and 144 illuminate the titania, activating the photoelectrolysis of the water. The resulting hydrogen 149 is injected into reservoir tank 148, or directly into the cylinder. Such a point-of-use hydrogen production could also be used with gasoline as the source of the hydrogen. Further, the hydrogen could be used to run fuel cells for electric vehicles, rather than for combustion engines. In any case, on-board storage of hydrogen, and losses associated with release of hydrogen from such storage means as metal hydrides, for example, are eliminated.

Figure 15:
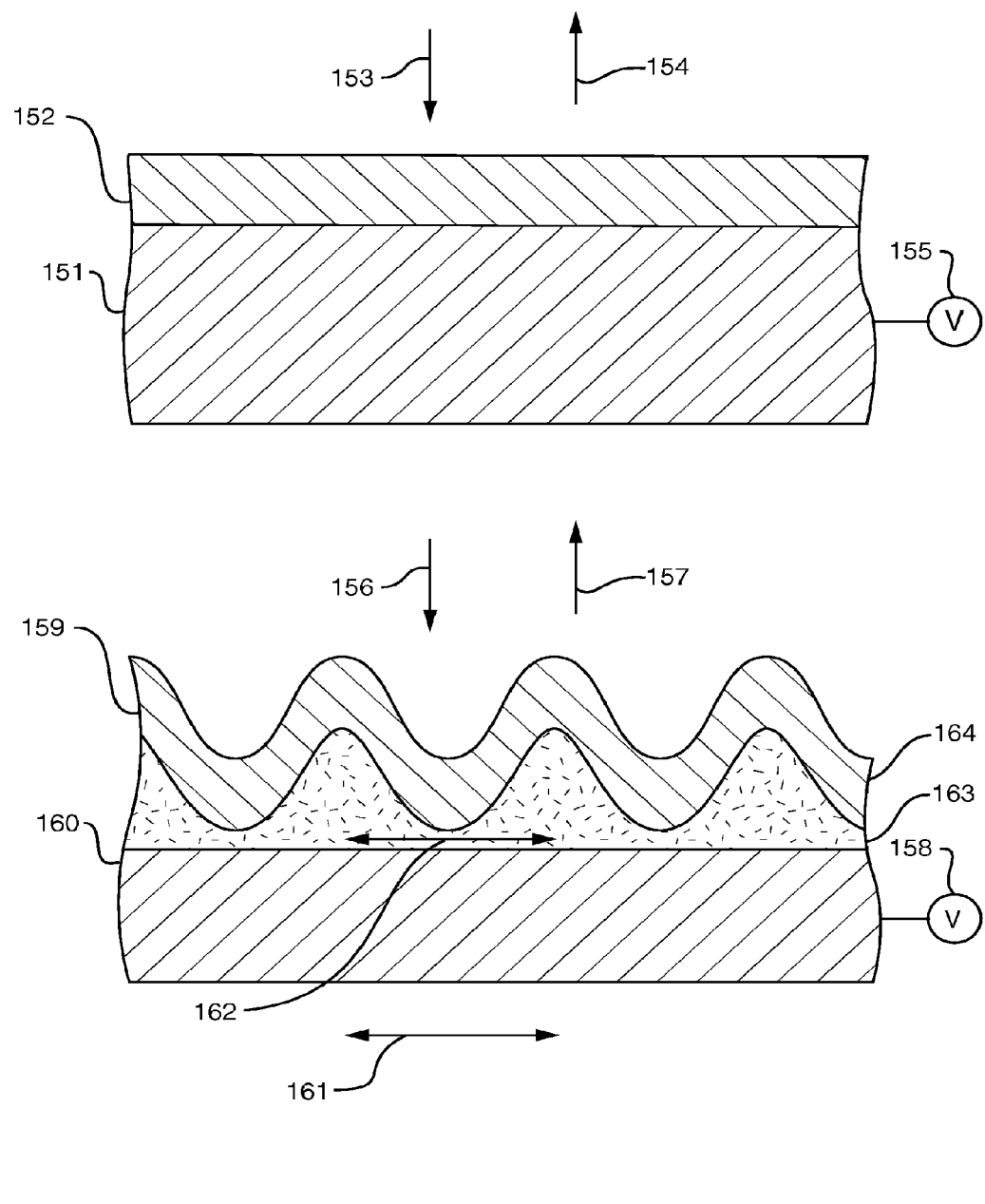
FIG. 15. Piezo-controlled stress in substrate

To this point, the stress induced in the titania layer is largely static and intrinsic to the substrate. FIG. 15 shows an application in which the substrate is a piezo crystal 151 and 160. Application of voltage V 155 and 158 causes the piezo crystal substrate to grow by a controlled and calibrated amount 161, which in turn causes tensile stress 162 in the titania layer 164 that is coated onto the undulating substrate 163 that is laminated to the piezo crystal, or in titania layer 152 that is coated directly onto the piezo crystal 151. Both devices shown in FIG. 15 will direct incident light 153 and 156 differently according to the amount of stress applied and therefore the amount of bandgap shifting, so that light 154 and 157 is redirected in a controlled manner. Such devices can be used for switching and tuning in photonic applications, including telecommunication network devices.

In summary, this invention provides for shifting the optical bandgap of a semiconductor into longer optical wavelengths by stressing the semiconductor, where the semiconductor is a thin film, and where the stress is caused by some or all of the following: conditions under which the thin film is coated, the shape of the substrate on a nano, micro, or macro scale, and the mechanical, chemical, and thermal properties of the substrate. The self-focusing of the illuminant also creates local heating, which also serves to shift the bandgap into longer wavelengths which are more abundant, for example, in the solar spectrum. Titania is the preferred semiconductor photocatalytic embodiment, but the invention applies to any semiconductor that is photo-active, such as silicon, germanium, and their alloys, and compounds that include, in addition, gallium. The stress-inducing template profiles also provide a mechanical lock to the coating so that the stress can exist without causing delamination of the coating from the substrate. In addition, the stress-inducing template profiles create additional surface area without increasing the footprint area of the surface, which creates higher efficiency in photocatalytic, photovoltaic, and photoelectrolytic action.

The source of hydrogen for the photoelectrolysis to act on can be water, sea water, an aqueous solution with electrolytes, or other hydrogen-bearing liquids such as gasoline.

The illumination is from the sun, the illumination is from artificial light, the illumination is further concentrated by the stress-inducing template shape by self-focusing, the concentration of the illumination is largely independent of incident illumination angle, thereby reducing or eliminating the need to track the sun in the sky, the stress-inducing profiles in the substrate may be one-dimensional or two-dimensional, the pitch of the stress-inducing profiles may be chosen relative to the desired illumination wavelength such that absorption is increased and reflection is decreased as in a photonic bandgap crystal, the thickness of the titania layer is chosen to be ¼ of the wavelength of the desired illumination, thereby acting as an anti-reflection filter and increasing absorption and decreasing reflection, the substrate surface profiles are chosen to be a certain shape, depth, and radius so that the titania film grows as lenses over the profiles, the thickness of the titania is chosen so that the focal plane of said lenses is coplanar with the distal surface of the titania layer, the additional effective surface created by the substrate stress-inducing profiles facilitates and improves heat dissipation, the semiconductor is vacuum coated onto or into the shaped substrate, the semiconductor is applied as a sol gel, the semiconductor is applied with chemical vapor deposition, the semiconductor is a contiguous film, the semiconductor is a matrix of particles such as spheres, the substrate can be polymer, glass, silicon, stainless steel, copper, aluminum, or substrate material, the photocatalyst is used to detoxify a medium in contact with it, the photocatalyst is used to disinfect a medium or biological agent in contact or proximal with it.

The substrate is transparent, the substrate is reflective, the substrate can be flexible, the substrate and titania coating are compatible with a roll-to-roll web manufacturing process, the substrate profiles are embossed into the substrate with a master, the substrate profiles are molded into the substrate, the substrate profiles are caused by reticulation in the substrate or in a layer applied to the substrate.

The titania-coated substrates can be stacked in layers to increase efficiency for a given area, and said titania-coated stacked substrates may be pre-coated on the opposite side with a transparent conducting electrode such as indium tin oxide (ITO), the titania-coated substrates are edge-illuminated, the semiconductor is strontium titanate ($SrTiO_3$), amorphous silicon, or other semiconductor, the titania-coated substrate(s) function as the anode in a photoelectrolytic cell, which further comprises some or all of the following: a housing, an aqueous electrolyte, a separation membrane, a cathode, and a bias source, where the photoelectrolysis converts solar energy into a chemically storable form, e.g. hydrogen, and may be further combined with a metal hydride or other adsorber.

The self-focusing provided by the nano-lens shape of the titania on the corrugated substrate improve performance in low light level applications.

The invention applications include both terrestrial and space environments.

The illuminant is a laser diode or laser, a spark between electrodes, or a flashlamp.

The hydrogen is produced at point of use by artificial illumination.

The substrate shape is used to increase or otherwise control the stress in the titania film, where the shape can be concave or convex or a mix of both, and the scale of pitch or radius of curvature can be from nanometers to meters. Or, the substrate is a piezo device such that the amount of stress induced in the titania film, and therefore the bandgap, is tunable over a range, for use in photonics. Or, the substrate is temperature controlled, such that by changing the temperature the substrate contracts or expands and causes a tunable bandgap shift in the titania or other photocatalyst layer. The substrate can also be a very small sphere, typically several microns in diameter but as small as tens of nanometers in diameter, and the material is a polymer, glass, metal, or other material, and is coated with titania or other suitable semiconductor, said sphere is one of many applied to a surface or surfaces, or are in suspension in a fluid, and can be applied by spraying, painting, or inkjet deposition. The substrate can also be a small diameter polymer or other fiber, and the titania-coated fiber is woven into fabrics for protective clothing or into paper for envelopes that are readily anti-biotic when illuminated with daylight or artificial light, where the application is photovoltaic, and the stress is enabling (titania) or improving (amorphous silicon).

Applications include photoelectrolysis, detoxification, disinfection, point-of-use photoelectrolysis for use in a hydrogen-based internal combustion engine, water desalination (where the product of combustion of the hydrogen and oxygen gases from photoelectrolysis is desalinated water), and point-of-use photocatalyst device is used in a hydrogen-based internal combustion engine, continual tuning of stress and bandgap properties for telecomm devices, and alteration and improving magnetic properties of thin films applied to hard drive disks for data storage.

This invention provides a corrugated substrate to which a desired titania or other thin film will adhere under stress but will not cause scatter or diffraction due to its sub-wavelength spatial period, thereby allowing low temperature deposition onto polymers, and where the sinusoidal interface at the high and low index thin film and substrate respectively further cause an effective index that varies gradually from one index to the other, with gradient index benefits of improved transmission and reduced reflection, The fact that the photocatalyst is a thin film reduces the probability of recombination of the hole and electron pairs that occurs in bulk semiconductors in the absence of an anode (or cathode) and electrolyte. The titania coating is evaporated from a titania target, a titanium target with oxygen bled into chamber, or a $Ti_xO_y$ target such as $Ti_2O_3$.

In addition, the titania coating may comprise rutile and/or anatase and/or other polymorphs, as well as amorphous titania. Additional thin films may be applied between the titania and the substrate in order to promote adhesion or to further modify the stress in the titania. Although the preferred embodiment has been described herein, it will be understood that surface features with other dimensions and shapes, substrates of other materials that are not polymers, substrates in non-planar shapes, and other semiconductors (such as SrTiO$_3$), even those requiring a bias voltage, are within the scope of this invention. For example, in amorphous silicon solar cells, the use of the corrugated template/substrate to cause the amorphous silicon film to be undulating would create stresses within the silicon layer sufficient to shift, decrease, and broaden the band-gap in the film, and thereby allow more efficient conversion of the solar spectrum of light into electricity.

While the invention has been described with reference to particular embodiments, it will be understood that the present invention is by no means limited to the particular constructions, and methods herein disclosed and/or shown in the drawings, but also comprises any modifications or equivalents within the scope of the claims.

The invention claimed is:

1. An apparatus for photocatalytic detoxification and/or disinfection of materials, the apparatus comprising a polymeric fiber or substantially spherical body bearing a stress-induced bandgap shifted semiconductor thin film on its surface, the semiconductor thin film, when exposed to light while in contact with a fluid, generating oxidizing species effective to cause detoxification and/or disinfection of the fluid.

2. An apparatus according to claim 1 wherein the semiconductor thin film comprises titania.

3. An apparatus according to claim 1 comprising a plurality of the polymeric fibers each having a semiconductor thin film thereon, the plurality of fibers being formed into a fabric.

4. An apparatus according to claim 3 wherein the fabric is formed into a filter or an envelope.

5. An apparatus according to claim 1 comprising a plurality of the substantially spherical bodies deposited upon a substrate.

6. An apparatus according to claim 1 wherein the curvature of the fiber or substantially spherical body induces regions of stress of at least about 1 GPa in the semiconductor thin film.

7. An apparatus according to claim 1 wherein the curvature of the fiber or substantially spherical body causes the bandgap of the semiconductor thin film to be shifted to lower values, decreased or broadened to allow more efficient generation of the oxidizing species during illumination.

8. An apparatus according to claim 1 comprising a reservoir for retaining liquid in contact with the semiconductor thin film.

9. An apparatus according to claim 2 wherein the semiconductor thin film is comprised of some or all of the following titania forms: anatase, rutile, brookite, and amorphous titania.

10. An apparatus according to claim 2 wherein regions of stress of at least about 1 GPa are induced in the semiconductor thin film.

11. An apparatus according to claim 2 wherein the bandgap of the semiconductor thin film is shifted to lower values, decreased or broadened to allow more efficient conversion of the light into oxidizing species.

12. An apparatus according to claim 1 wherein at least one thin film layer is added between the polymeric fiber or substantially spherical body and the semiconductor thin film to promote at least one of adhesion, conductivity, and additional stress control.

* * * * *